United States Patent
Minegishi et al.

(10) Patent No.: US 9,274,422 B2
(45) Date of Patent: Mar. 1, 2016

(54) PHOTOSENSITIVE RESIN COMPOSITION, METHOD FOR FORMING PATTERN-CURED FILM USING PHOTOSENSITIVE RESIN COMPOSITION, AND ELECTRONIC COMPONENT

(75) Inventors: Tomonori Minegishi, Tsukuba (JP); Shigeki Katogi, Hitachi (JP)

(73) Assignee: HITACHI CHEMICAL DUPONT MICROSYSTEMS, LTD., Tokyo (JP)

( * ) Notice: Subject to any disclaimer, the term of this patent is extended or adjusted under 35 U.S.C. 154(b) by 92 days.

(21) Appl. No.: 14/126,107

(22) PCT Filed: Jun. 13, 2012

(86) PCT No.: PCT/JP2012/003846
§ 371 (c)(1),
(2), (4) Date: Dec. 13, 2013

(87) PCT Pub. No.: WO2012/172793
PCT Pub. Date: Dec. 20, 2012

(65) Prior Publication Data
US 2014/0120462 A1    May 1, 2014

(30) Foreign Application Priority Data

Jun. 15, 2011 (JP) .................. 2011-133427

(51) Int. Cl.
| | |
|---|---|
| G03F 7/40 | (2006.01) |
| G03F 7/028 | (2006.01) |
| G03F 7/004 | (2006.01) |
| C08G 73/22 | (2006.01) |
| G03F 7/023 | (2006.01) |
| G03F 7/085 | (2006.01) |
| G03F 7/038 | (2006.01) |

(52) U.S. Cl.
CPC ............... *G03F 7/028* (2013.01); *C08G 73/22* (2013.01); *G03F 7/0045* (2013.01); *G03F 7/0233* (2013.01); *G03F 7/0387* (2013.01); *G03F 7/085* (2013.01); *G03F 7/40* (2013.01)

(58) Field of Classification Search
CPC ..... G03F 7/0387; G03F 7/028; G03F 7/0233; G03F 7/40; G03F 7/0045; G03F 7/085; C08G 73/22

USPC .......... 430/18, 270.1, 281.1, 325, 330
See application file for complete search history.

(56) References Cited

U.S. PATENT DOCUMENTS

| | | | |
|---|---|---|---|
| 4,395,482 A | 7/1983 | Ahne et al. | |
| 2004/0253537 A1* | 12/2004 | Rushkin et al. | 430/270.1 |

FOREIGN PATENT DOCUMENTS

| | | |
|---|---|---|
| JP | 64-60630 | 3/1989 |
| JP | 2007-017959 | 1/2007 |
| JP | 2008-040324 | 2/2008 |
| JP | 2008-535003 | 8/2008 |
| JP | 2009-265520 | 11/2009 |
| JP | 2009-283711 | 12/2009 |
| JP | 2010-008851 | 1/2010 |
| JP | 2010-96927 | 4/2010 |
| JP | 2010-197748 | 9/2010 |
| JP | 2011-053458 | 3/2011 |
| JP | 2011-164289 | 8/2011 |
| WO | 2006/104803 A2 | 10/2006 |

OTHER PUBLICATIONS

Notification of Transmittal of Translation of the International Preliminary Report on Patentability mailed Jan. 3, 2014, for International Application No. PCT/JP2012/003846.
International Search Report dated Jul. 24, 2012, for PCT Application No. PCT/JP2012/003846.
R. Okuda, et al., "Polyimide Coatings for OLED Applications" *Journal of Photopolymer Science and Technology*, vol. 17, No. 2, 2004, pp. 207-213.
Communication mailed Aug. 18, 2015, for Japanese Application No. 2013-520434; 4 pages.
INPADOC patent family list for JP 2008535003; 1 page, (Aug. 2008).

* cited by examiner

*Primary Examiner* — John A McPherson
(74) *Attorney, Agent, or Firm* — Fitch, Even, Tabin & Flannery LLP

(57) ABSTRACT

A photosensitive resin composition including: (a) a polybenzoxazole precursor; (b) a photosensitizer; (c) a solvent; (d) a cross-linking agent; and (e) a heterocyclic compound including a hydroxyl group, an alkoxy group or a carboxyl group within a molecule.

18 Claims, 1 Drawing Sheet

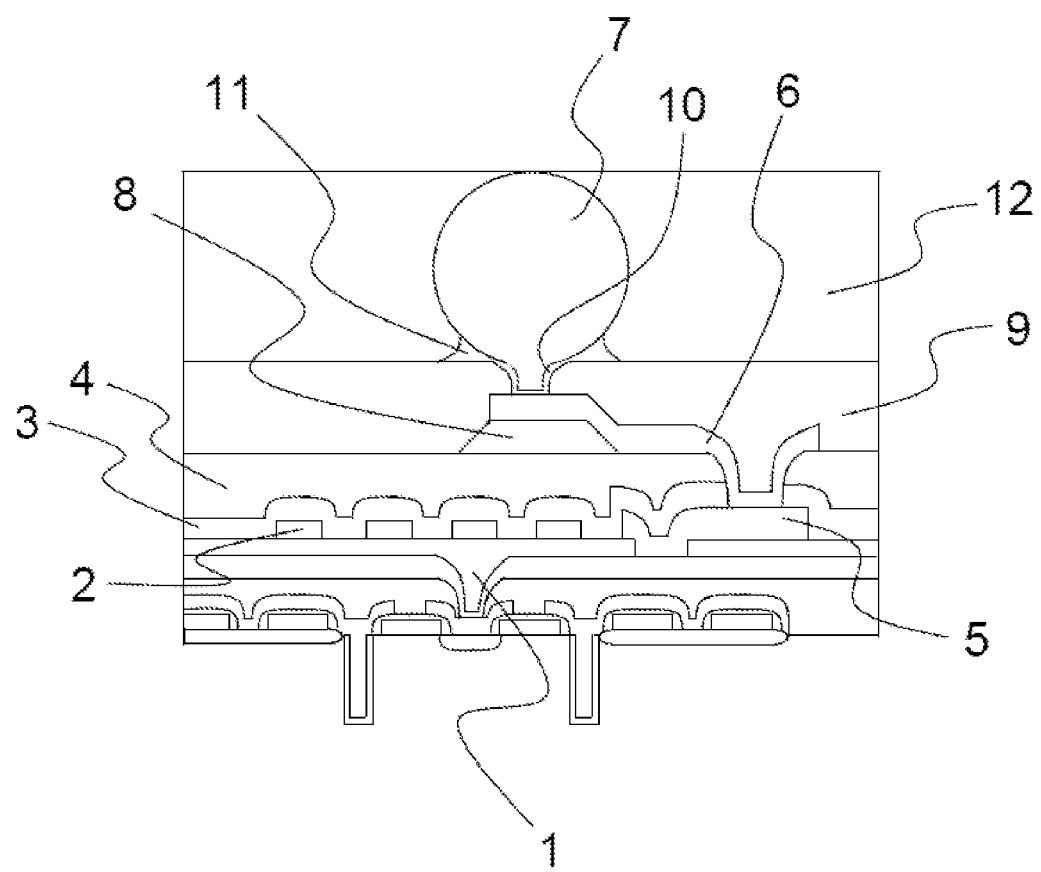

PHOTOSENSITIVE RESIN COMPOSITION, METHOD FOR FORMING PATTERN-CURED FILM USING PHOTOSENSITIVE RESIN COMPOSITION, AND ELECTRONIC COMPONENT

TECHNICAL FIELD

The present invention relates to a photosensitive resin composition, a method for forming a pattern-cured film using the resin composition and an electronic component. In particular, the present invention relates to a photosensitive resin composition which is excellent in adhesiveness, heat resistance and chemicals resistance under high temperature and high humidity conditions, and is capable of obtaining a well-shaped pattern, a method for producing a pattern-cured film using the resin composition and electronic components.

BACKGROUND ART

Conventionally, for a surface-protective film and an interlayer insulating film of a semiconductor device, a polyimide having, in combination, excellent heat resistance, electrical properties, mechanical properties or the like has been used. In recent years, a photosensitive polyimide obtained by providing a polyimide itself with photosensitive properties has been used. By using such a photosensitive polyimide, there are advantages that pattern-forming steps can be simplified, whereby a complicated production steps can be shortened.

For developing a photosensitive polyimide, an organic solvent such as N-methylpyrrolidone has been used. In recent years, in respect of environment protection, a positive-type photosensitive polyimide which can be developed with an aqueous alkaline solution has been proposed. As a method for forming a positive-type photosensitive polyimide, a method in which a naphthoquinone diazide compound as a photosensitizing agent is mixed with a polyimide or a polyimide precursor has been proposed (see Patent Documents 1 and 2, for example).

Further, recently, as a positive-type photosensitive resin which can be developed by an aqueous alkaline solution, polybenzoxazole or a polybenzoxazole precursor has been proposed. As compared with a polyimide or a polyimide precursor, polybenzoxazole or a polybenzoxazole precursor has a large difference in dissolution speed between an exposed part and un-exposed part, and hence, a more precise pattern can be formed (see Patent Document 3, Non-Patent Document 1, for example).

RELATED ART DOCUMENTS

Patent Documents

Patent Document 1: JP-A-S64-60630
Patent Document 2: U.S. Pat. No. 4,395,482
Patent Document 3: JP-A-2009-265520

Non-Patent Document

J. Photopolym. Sci. Technol., vol. 17, 207-213.

SUMMARY OF THE INVENTION

In recent years, with a trend for higher integration and reduction in size of a semiconductor device, there has been a demand for reduction in thickness and size of a package substrate, or the like. Under such circumstances, in order to suppress substrate damage, when forming an interlayer insulating film and a surface-protective film of such a semiconductor device, a production process at low temperatures has been desired. However, a polybenzoxazole precursor disclosed in Non-Patent Document 1 is required to be subjected to a cyclodehydration reaction at high temperatures during a heat-treatment step of forming a pattern-cured film (see, Non-Patent Document 1, for example). If a photosensitive resin composition containing this polybenzoxazole precursor is subjected to a cyclodehydration reaction at low temperatures of 250° C. or less, properties of a pattern-cured film such as chemicals resistance, adhesiveness to a substrate or the like tends to be lowered. In particular, with diversification of application fields of a semiconductor device, an interlayer insulating film and a surface-protective film using a photosensitive resin composition are required to have adhesiveness with a substrate at high temperature and high humidity conditions. However, by cyclodehydration at low temperatures, it is difficult to impart sufficient adhesiveness with a substrate under high temperature and high humidity conditions.

The present invention provides a photosensitive resin composition which exhibits a high cyclodehydration ratio even if a heat treatment is conducted at 250° C. or less, has excellent chemicals resistance and excellent adhesiveness with a substrate under high temperature and high humidity conditions. Further, the present invention provides a method for producing a pattern-cured film using the photosensitive resin composition. The present invention is also aimed at providing a highly reliable electronic component due to the presence of an interlayer insulating film or a surface-protective film using the pattern-cured film.

According to the present invention, the following photosensitive resin composition is provided.

That is, the photosensitive composition of the present invention comprises (a) a polybenzoxazole precursor, (b) a sensitizing agent, (c) a solvent, (d) a cross-linking agent, and (e) a heterocyclic compound which has a hydroxyl group, an alkoxy group or a carboxyl group within the molecule.

In the photosensitive resin composition of the present invention, it is preferred that the component (a) have a structural unit represented by the following formula (I):

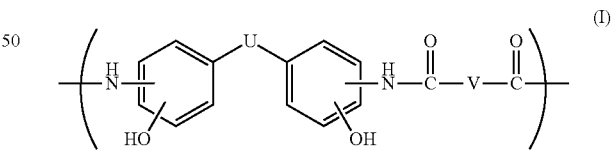

wherein U is a divalent organic group, a single bond, —O—, or —SO$_2$—; V is a divalent organic group, and at least V is a group comprising an aliphatic structure having 1 to 30 carbon atoms or U is a group comprising an aliphatic structure of which the main chain has 2 to 30 carbon atoms.

In the photosensitive resin composition of the present invention, it is preferred that the component (e) be a compound comprising any of an imidazole ring, a triazole ring or a thiazole ring. It is more preferred that the component (e) be any of the compounds represented by the following general formulas (II) to (VIII).

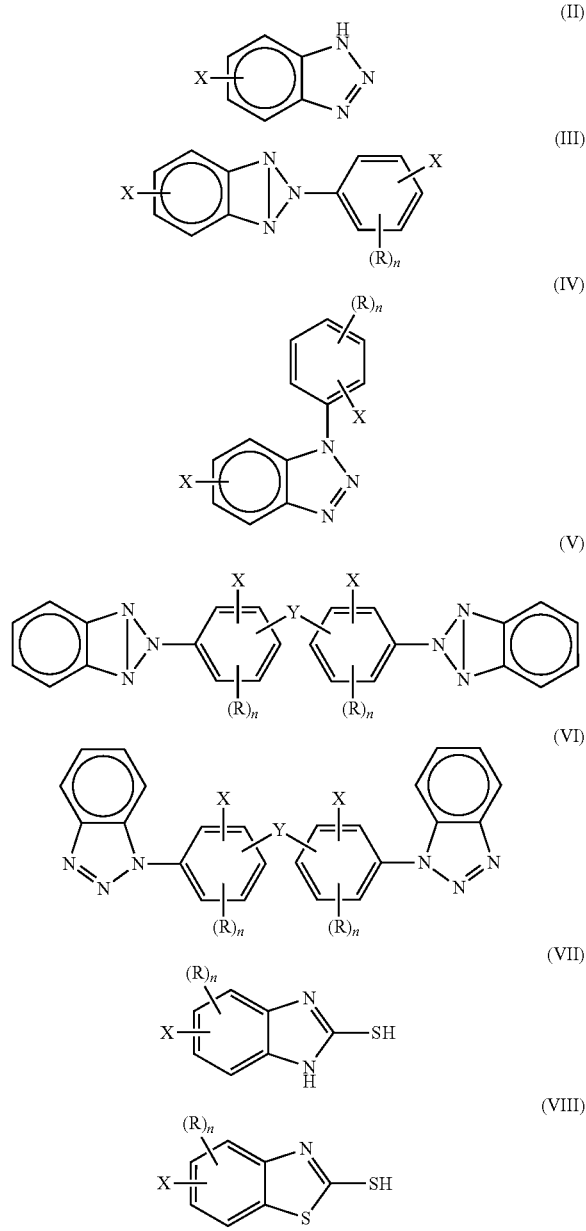

wherein X is independently a hydroxyl group, an alkoxy group having 1 to 6 carbon atoms or a carboxyl group; Y is a single bond or a group selected from —O—, —SO$_2$— and a divalent organic group; and R is independently a hydrogen atom or an alkyl group having 1 to 10 carbon atoms. n is the number of R, and in the formulas (III) and (IV), n is an integer of 0 to 4, and in the formulas (V), (VI), (VII) and (VIII), n is an integer of 0 to 3.

It is further preferred that the component (e) be a compound represented by the formula (III).

Further, in the photosensitive resin composition of the present invention, it is preferred that the component (d) be a compound having a methylol group or an alkoxyalkyl group.

In the photosensitive resin composition of the present invention, it is preferred that the component (b) be a compound which generates an acid or a radical by exposure to light.

A method for producing a pattern-cured film according to the present invention comprises the steps of:

applying the photosensitive resin composition on a supporting substrate, and drying to form a photosensitive resin film;

exposing to light the photosensitive resin film obtained by the application and drying steps in a prescribed pattern;

developing the photosensitive resin film after the light-exposure by an aqueous alkaline solution; and subjecting the photosensitive resin film after the development to a heat treatment.

In the method for producing a pattern-cured film according to the present invention, in the step of subjecting the photosensitive resin film after the development to a heat treatment, the heat treatment temperature is preferably 250° C. or less, more preferably 200° C. or less.

The interlayer insulating film or the surface-protective film of the present invention can be obtained by the method for producing the pattern-cured film mentioned above. Further, the electronic component of the present invention has the interlayer insulating film or the surface-protective film.

By using the photosensitive resin composition of the present invention, it is possible to form a pattern-cured film which exhibits a high cyclodehydration ratio and has high chemicals resistance and adhesiveness to a substrate under high temperature and high humidity conditions even when conducting a heat treatment at 250° C. or less. The photosensitive resin composition of the present invention has a sufficient sensitivity, a high resolution, an excellent heat resistance and excellent mechanical properties which are not inferior to those obtained when a heat treatment is conducted at high temperatures.

In addition, the photosensitive resin composition of the present invention is capable of forming a pattern-cured film having chemicals resistance and adhesiveness to a substrate at high temperature and high humidity conditions even if a heat treatment is conducted at 200° C. or less.

According to the method for producing a pattern-cured film of the present invention, by using the above-mentioned photosensitive resin composition, a pattern-cured film improved in heat resistance and adhesiveness can be obtained. Further, the present invention can provide a highly reliable electronic component due to the presence of an interlayer insulating film and a surface-protective film using the pattern-cured film.

BRIEF DESCRIPTION OF THE DRAWINGS

FIG. 1 is a schematic cross-sectional view of a semiconductor device having a re-wiring structure which is an embodiment of the present invention.

MODE FOR CARRYING OUT THE INVENTION

Hereinbelow, the embodiment of the photosensitive resin composition, the method for producing a pattern-cured film using the resin composition and the electronic component according to the present invention will be explained in detail. The present invention is, however, not limited to the following embodiment.

[Photosensitive Resin Composition]

At first, an explanation will be made on the photosensitive resin composition of the present invention. The photosensitive resin composition according to the present invention comprises (a) a polybenzoxazole precursor, (b) a sensitizer, (c) a solvent, (d) a cross-linking agent, and (e) a heterocyclic compound which has a hydroxyl group, an alkoxy group or a carboxyl group within the molecule. In the specification of the present invention, these components are often abbreviated simply as the component (a), the component (b), the component (c), the component (d) and the component (e). Hereinbelow, each component will be explained.

(Component (a): Polybenzoxazole Precursor)

The polybenzoxazole precursor as the component (a) of the present invention includes its copolymers. The polybenzoxazole precursor is normally developed with an aqueous alkaline solution, and hence, it is preferred that the polybenzoxazole precursor be soluble in an aqueous alkaline solution. The aqueous alkaline solution is an alkaline solution such as an aqueous solution of tetramethylammonium hydroxide, an aqueous solution of a metal hydroxide, an aqueous solution of an organic amine or the like. Normally, an aqueous solution of tetramethylammonium hydroxide having a concentration of 2.38 wt % is used. Therefore, it is more preferred that the component (a) be soluble in this aqueous solution.

One standard that the component (a) of the present invention is considered to be soluble in an aqueous alkaline solution will be explained below. A resin solution obtained from component (a) alone and an arbitral solvent or from component (a) and component (b), component (c), component (d) and component (e) explained later in sequence is applied to a substrate such as silicon wafer by spin coating to form a resin film having a thickness of about 5 μm. This resin film is immersed in any one of an aqueous solution of tetramethylammonium hydroxide, an aqueous solution of a metal hydroxide and an aqueous solution of an organic amine at 20 to 25° C. When it can be dissolved to form a homogeneous solution, the component (a) used is judged to be soluble in an aqueous alkaline solution.

In respect of capability of exhibiting excellent mechanical properties and heat resistance, it is preferred that the photosensitive resin composition of the present invention contain, as component (a), a compound having a structural unit represented by the following formula (I):

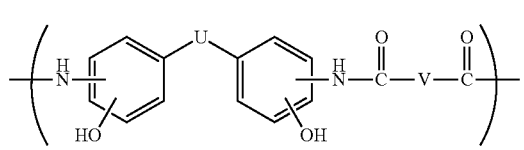

In the formula (I), U is a divalent organic group, a single bond, —O— or —SO$_2$—, and V is a divalent organic group. V is a divalent organic group. As for U and V, at least V is a group comprising an aliphatic structure having 1 to 30 carbon atoms or U is a group comprising an aliphatic structure of which the main chain has 2 to 30 carbon atoms.

The hydroxyl group and the amide group connecting on the same benzene ring in the structural unit represented by the formula (I) are converted to an oxazole ring excellent in heat resistance, mechanical properties and electrical properties by a cyclodehydration reaction during a heating step.

In the present invention, it is preferred that component (a) be a compound having a structural unit represented by the following formula (IX) since it has a high cyclodehydration ratio in the heating step at a temperature of 250° C. or less and exhibits excellent heat resistance, good mechanical properties and high transparency in the UV and visible region.

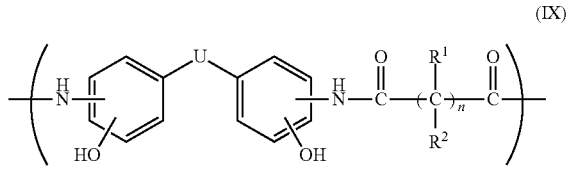

wherein U is a divalent organic group, a single bond, —O— or —SO$_2$—; $R^1$ and $R^2$ are independently hydrogen, fluorine or an alkyl group having 1 to 6 carbon atoms; and n is an integer of 1 to 30.

Further, in the compound having the structural unit represented by the formula (IX), n can be 2 to 30 or 4 to 20. It is preferred that n be an integer of 7 to 30. If n is an integer of 7 to 30, a pattern-cured film has a low elasticity, and has a sufficient break elongation. When n is an integer of 7 to 30, the photosensitive resin composition is dissolved easily in a solvent such as N-methyl-2-pyrrolidone, γ-butyrolactone, propylene glycol monomethyl ether acetate or the like, whereby storage stability is improved.

A polybenzoxazole precursor having a structural unit represented by the formula (I) or (IX) can be synthesized by a synthesis method mentioned later normally by using dicarboxylic acid or a dicarboxylic acid derivative (hereinafter referred to as the "dicarboxylic acid") and a diamine having a dihydroxy group. In the formula (I) or (IX), U is a group contained in the residue of a diamine and V is a residue of a dicarboxylic acid.

Examples of a diamine that gives the divalent organic group, the single bond, —O—, or —SO$_2$— represented by U in the formulas (I) and (IX) include, although not limited thereto, 3,3'-diamino-4,4'-dihydroxybiphenyl, 4,4'-diamino-3,3'-dihydroxybiphenyl, bis(3-amino-4-hydroxyphenyl)sulfone, bis(4-amino-3-hydroxyphenyl)sulfone, 2,2-bis(3-amino-4-hydroxyphenyl)-1,1,1,3,3,3-hexafluoropropane, 2,2-bis(4-amino-3-hydroxyphenyl)-1,1,1,3,3,3-hexafluoropropane, 2,2-bis(3-amino-4-hydroxyphenyl)propane, and 2,2-bis(4-amino-3-hydroxyphenyl)propane. These diamines can be used singly or in combination of two or more.

In the formulas (I) and (IX), if U is a group comprising an aliphatic structure of which the main chain has 2 to 30 carbon atoms, as a diamine that gives such a polybenzoxazole precursor, a diamine having an aliphatic structure having 2 to 30 carbon atoms can be used. For example, a compound represented by the following formula can be given.

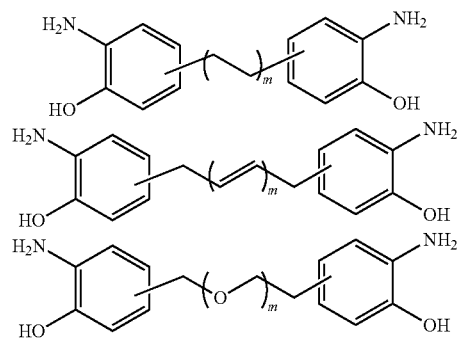

wherein m is an integer of 1 to 6.

In the formula (I), examples of a dicarboxylic acid that gives a divalent organic group represented by V include, though not limited thereto, isophthalic acid, terephthalic acid, 2,2-bis(4-carboxyphenyl)-1,1,1,3,3,3-hexafluoropropane, 4,4'-dicarboxybiphenyl, 4,4'-dicarboxydiphenylether, 4,4'-dicarboxytetraphenylsilane, bis(4-carboxyphenyl)sulfone, 2,2-bis(p-carboxyphenyl)propane, 5-tert-butylisophthalic acid, 5-bromoisophthalic acid, 5-fluoroisophthalic acid, 5-chloroisophthalic acid and 2,6-naphthalenedicarboxylic acid. These compounds can be used singly or in combination of two or more.

In the formula (I), if V is a group comprising an aliphatic structure having 1 to 30 carbon atoms, as a dicarboxylic acid that gives such polybenzoxazole precursor, malonic acid, dimethylmalonic acid, ethylmalonic acid, isopropylmalonic acid, di-n-butylmalonic acid, succinic acid, tetrafluorosuccinic acid, methylsuccinic acid, 2,2-dimethylsuccinic acid, 2,3-dimethylsuccinic acid, dimethylmethylsuccinic acid, glutaric acid, hexafluoroglutaric acid, 2-methylglutaric acid, 3-methylglutaric acid, 2,2-dimethylglutaric acid, 3,3-dimethylglutaric acid, 3-ethyl-3-methylglutaric acid, adipic acid, octafluoroadipic acid, 3-methyladipic acid, pimelic acid, 2,2,6,6-tetramethylpimelic acid, suberic acid, dodecafluorosuberic acid, azelaic acid, sebacic acid, hexadecafluorosebacic acid, 1,9-nonanedioic acid, dodecanedioic acid, tridecanedioic acid, tetradecanedioic acid, pentadecanedioic acid, hexadecanedioic acid, heptadecanedioic acid, octadecanedioic acid, nonadecanedioic acid, eicosanedioic acid, heneicosanedioic acid, docosanedioic acid, tricosanedioic acid, tetracosanedioic acid, pentacosanedioic acid, hexacosanedioic acid, heptacosanedioic acid, octacosanedioic acid, nonacosanedioic acid, triacontanedioic acid, hentriacontanedioic acid, dotriacontanedioic acid, diglycolic acid and a dicarboxylic acid represented by the following general formula.

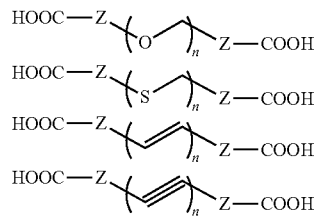

wherein Z is a hydrocarbon group having 1 to 6 carbon atoms, and n is an integer of 1 to 6.

If the component (a) has a structural unit represented by the formula (IX), these compounds can be used as a dicarboxylic acid.

The polybenzoxazole precursor having a structural unit represented by the formula (I) may be a copolymer. For example, a polybenzoxazole precursor having a structural unit represented by the following formula (X) can be used.

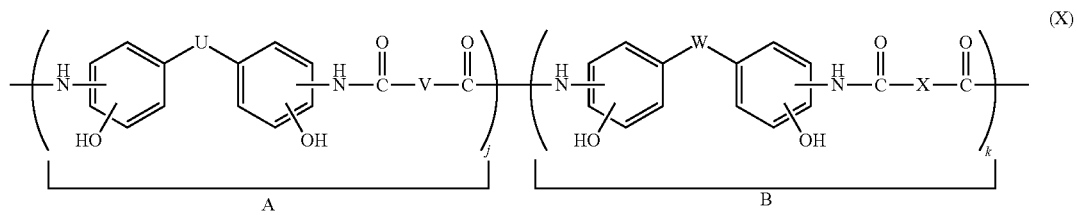

wherein U and W are independently a divalent organic group, a single bond, —O—, or —SO$_2$—; and V and X are independently a divalent organic group. As for U and V, at least V is a group comprising an aliphatic structure having 1 to 30 carbon atoms or U is a group comprising an aliphatic structure of which the main chain has 2 to 30 carbon atoms. The structural unit A is a structural unit site represented by the formula (I). j and k are the molar fraction of the structural unit A and the structural unit B, and the total of j and k is 100 mol %.

The molar fraction of j and k in the formula is preferably j=15 to 95 and k=5 to 85 mol %, in respect of pattern properties, mechanical properties, heat resistance and chemicals resistance.

The residue of an amine having a hydroxyl group represented by the formula (X) is converted to oxazole having excellent mechanical properties, heat resistance and electrical resistance by cyclodehydration during the heating step.

The copolymer may be a block copolymer or a random copolymer. The formula (X) indicates the structural unit and the bonding between the structural units, and does not indicate a block copolymer. The same applies to the formula (XI) or (XII) mentioned later.

Further, as the polybenzoxazole precursor having a structural unit represented by the formula (I), a polybenzoxazole precursor having a structural unit represented by the following formula (XI) or (XII) can be used. The structural unit represented by the formula (XI) or (XII) has a structural unit of polybenzoxazole other than the structural unit represented by the formula (I), a structural unit of polyimide or a polyimide precursor (polyamide acid, polyamide acid ester, or the like).

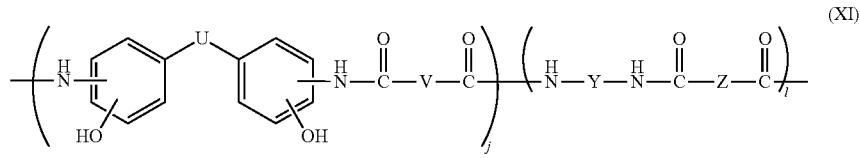

wherein U and Y are independently a divalent organic group, a single bond, —O— or —SO$_2$—, and V and Z are independently a divalent organic group. As for U and V, at least V is a group comprising an aliphatic structure having 1 to 30 carbon atoms or U is a group comprising an aliphatic structure of which the main chain has 2 to 30 carbon atoms. j and l are respectively the molar fraction of each structural unit, the total of j and l is 100 mol %, j is 60 to 99.9 mol % and l is 0.1 to 40 mol %.

Here, the solubility in an aqueous alkaline solution depends on the hydroxyl group which bonds to the benzene ring (in general, a phenolic hydroxyl group). Therefore, the molar fraction of j and l in the formula is preferably j=80 to 99.9 mol % and l=0.1 to 20 mol %.

"X-22-161C" and "X-22-161E" (product name, manufactured by Shin-Etsu Chemical Co., Ltd.) can be given.

A diamine that gives a divalent organic group represented by Y is not limited to these. These compounds are used singly or in combination of two or more.

The molecular weight of the component (a) is preferably 3,000 to 200,000 in terms of weight-average molecular weight, more preferably 5,000 to 100,000. Here, the molecular weight is a value obtained by measuring by the gel permeation chromatography method and converting by using a standard polystyrene calibration line.

In the invention, no specific restrictions are imposed on the method for producing a polybenzoxazole precursor. For example, a polybenzoxazole precursor having a structural

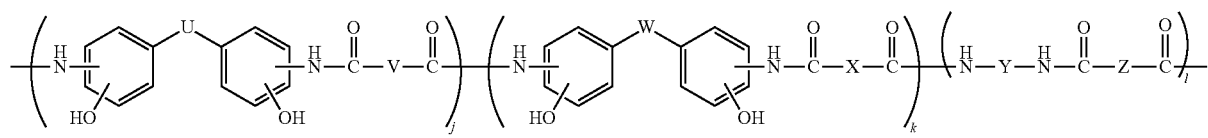

(XII)

wherein U, W and Y are independently a divalent organic group, a single bond, —O—, or —SO$_2$—, and V, X and Z are independently a divalent organic group. As for U and V, at least V is a group comprising an aliphatic structure having 1 to 30 carbon atoms or U is a group comprising an aliphatic structure of which the main chain has 2 to 30 carbon atoms. j, k and l are independently a molar fraction of each structural unit, and the total of j, k and l is 100 mol %, the total of j and k (j+k) is 60 to 99.9 mol % and l is 0.1 to 40 mol %.

Here, the solubility in an aqueous alkaline solution depends on the hydroxyl group which bonds to the benzene ring (in general, a phenolic hydroxyl group). Therefore, in respect of solubility in an alkaline solution, the molar fraction of j, k and l in the formula is preferably j+k=80 to 99.9 mol % and l=0.1 to 20 mol %. In the formulas (XI) and (XII), Y is different from U and W, and in general, Y is a residue of a diamine which does not include a phenolic hydroxyl group.

In the formulas (XI) and (XII), examples of the group represented by U and W are residues of a diamine which are mentioned above as a diamine that gives a group represented by U in the formulas (I) and (X). The divalent organic group represented by V, X and Z is a residue of a dicarboxylic acid mentioned above as a dicarboxylic acid that gives a group represented by V in the formula (I).

It is preferred that Y be a divalent aromatic group or aliphatic group. A divalent aromatic group or aliphatic group having 4 to 40 carbon atoms is preferable, with a divalent aromatic group having 4 to 40 carbon atoms being more preferable.

As a diamine that gives a divalent organic group represented by Y in the formula (XII), aromatic diamine compounds such as 4,4'-diaminodiphenyl ether, 4,4'-diaminodiphenylmethane, 4,4'-diaminodiphenylsulfone, 4,4'-diaminodiphenylsulfide, bendizine, m-phenylenediamine, p-phenylenediamine, 1,5-naphthalenediamine, 2,6-naphthalenediamine, bis(4-aminophenoxyphenyl)sulfone, bis(3-aminophenoxyphenyl)sulfone, bis(4-aminophenoxy)biphenyl, bis[4-(4-aminophenoxy)phenyl]ether and 1,4-bis(4-aminophenoxy)benzene can be given.

Further, as a diamine compound having a silicone group, "LP-7100", "X-22-161AS", "X-22-161A", "X-22-161B", unit represented by the above-mentioned formulas (I) and (X) can generally be synthesized from a dicarboxylic acid and a diamine having a hydroxyl group.

Specifically, it can be synthesized by converting a dicarboxlic acid to a dihalide derivative, and reacting the dihalide derivative with a diamine. As the dihalide derivative, a dichloride derivative is preferable.

A dichloride derivative can be synthesized by a method in which a dicarboxylic acid and a halogenating agent are reacted in a solvent or in an excessive halogenating agent, and, thereafter, an excess content is distilled off. As the halogenating agent, thionyl chloride, phosphoryl chloride, phosphorus oxychloride, phosphorus pentachloride or the like, which are used in a normal acid chlorination reaction of carboxylic acid can be used. As the reaction solvent, N-methyl-2-pyrrolidone, N-methyl-2-pyridone, N,N-dimethylacetoamide, N,N-dimethylformamide, toluene, benzene or the like can be used.

The amount of the halogenating agent is preferably 1.5 to 3.0 mol, more preferably 1.7 to 2.5 mol, relative to the amount of a dicarboxylic acid derivative when a reaction is conducted in a solvent. When a reaction is conducted in a halogenating agent, the amount of the halogenating agent is preferably 4.0 to 50 mol, more preferably 5.0 mol to 20 mol. The reaction temperature is preferably −10° C. to 70° C., more preferably 0 to 20° C.

It is preferred that the reaction of a dichloride derivative and a diamine be conducted in an organic solvent in the presence of a dehydrohalogenating agent. As the dehydrohalogenating agent, an organic base such as pyridine and triethylamine can be used. As the organic solvent, N-methyl-2-pyrrolidone, N-methyl-2-pyridone, N,N-dimethylacetoamide, N,N-dimethylformamide or the like can be used. The reaction temperature is preferably −10 to 30° C., with 0 to 20° C. being more preferable.

(Component (b): Photosensitizer)

The photosensitive resin composition of the invention comprises a photosensitizer (b) together with the above-mentioned polybenzoxazole precursor. This photosensitizer, when a photosensitive resin composition is applied to a substrate and the thus formed photosensitive resin film is exposed to light, reacts with light to allow the solubility for a developer of an exposed part and that of an un-exposed part to be different. Although no specific restrictions are imposed on the photosensitizer used as the component (b) in the present invention, it is preferred that the photosensitizer be one that generates an acid or a radical upon exposure to light.

When the photosensitive resin composition of the invention is used as a positive-type photosensitive resin composition, it is preferred that the photosensitizer (b) be one that has a function of generating an acid (photoacid generator) when exposed to light. A photoacid generator is one that generates an acid when exposed to light and increases the solubility of a light-exposed part in an aqueous alkaline solution. As such a photoacid generator, an o-quinonediazide compound, an aryldiazonium salt, a diaryliodonium salt, a triarylsulfonium salt or the like can be given. In respect of exhibiting excellent sensitivity, it is preferable to use an o-quinonediazide compound.

The above-mentioned o-quinonediazide compound can be obtained by condensation reaction of an o-quinonediazide sulfonylchloride and a hydroxyl compound, an amino compound or the like in the presence of a dehydrochlorinating agent.

As examples of the o-quinonediazide sulfonylchloride, benzoquinone-1,2-diazide-4-sulfonylchloride, 1,2-naphthoquinone-2-diazide-5-sulfonylchloride, 1,2-naphthoquinone-2-diazide-4-sulfonylchloride or the like can be used.

As the hydroxyl compound, hydroquinone, resorcinol, pyrogallol, bisphenol A, bis(4-hydroxyphenyl)methane, 2,2-bis(4-hydroxyphenyl)hexafluoropropane, 2,3,4-trihydroxybenzophenone, 2,3,4,4'-tetrahydroxybenzophenone, 2,2',4,4'-tetrahydroxybenzophenone, 2,3,4,2',3'-pentahydroxybenzophenone, 2,3,4,3',4',5'-hexahydroxybenzophenone, bis(2,3,4-trihydroxyphenyl)methane, bis(2,3,4-trihydroxyphenyl)propane, 4b,5,9b,10-tetrahydro-1,3,6,8-tetrahydroxy-5,10-dimethylindeno[2,1-a]indene, tris(4-hydroxyphenyl)methane, tris(4-hydroxyphenyl)ethane or the like can be used.

As the amino compound, p-phenylenediamine, m-phenylenediamine, 4,4'-diaminodiphenylether, 4,4'-diaminodiphenylmethane, 4,4'-diaminodiphenylsulfone, 4,4'-diaminodiphenylsulfide, o-aminophenol, m-aminophenol, p-aminophenol, 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, bis(3-amino-4-hydroxyphenyl)hexafluoropropane, bis(4-amino-3-hydroxyphenyl)hexafluoropropane or the like can be used.

As for the reaction between the o-quinonediazide sulfonylchloride and the hydroxyl compound or the amino compound, it is preferred that they be compounded such that the total of the hydroxyl group and the amino group be 0.5 to 1 equivalent per mole of the o-quinonediazide sulfonylchloride. The preferable amount range of the dehydrochlorinating agent and the o-quinonediazide sulfonylchloride is 0.95/1 to 1/0.95. The preferable reaction temperature is 0 to 40° C. and the preferable reaction time is 1 to 10 hours.

As the reaction solvent of the above-mentioned reaction, a solvent such as dioxane, acetone, methyl ethyl ketone, tetrahydrofuran, diethyl ether and N-methylpyrrolidone can be used. As the dehydrochlorinating agent, sodium carbonate, sodium hydroxide, sodium hydrogen carbonate, potassium carbonate, potassium hydroxide, trimethylamine, triethylamine, pyridine or the like can be given.

If the structure shown by V, X, Y and Z in the formulas (I), (X), (XI) and (XII) has a light-cross-linkable group such as an acryloyl group and a methacryloyl group, it is preferred that one generates that a radical (photopolymerization initiator) be used as the component (b) (photosensitizer). If a photopolymerization initiator is used as the component (b), it is possible to use the photosensitive resin composition as a negative-type photosensitive resin composition. As the photopolymerization initiator, a known initiator such as an acetophenone derivative, an acylphosphine oxide, an oxime, a benzophenone derivative and thitanocene can be used.

As the acetophenone derivative, a benzylketal such as benzyldimethylketal, α-hydroxyacetophenone such as α,α,α-hydroxydimethylacetophenone, and α-aminoacetophenone such as 2-(dimethylamino)-2-[(4-methylphenyl)methyl] or the like can be used.

As the acylphosphine oxide, 2,4,6-trimethylbenzoyl-diphenyl-phosphine oxide, bis(2,4,6-trimethylbenzoyl)-phenylphosphine oxide or the like can be given.

As the oxime, 1-[4-(phenylthiophenyl)-1,2-octanedione-2-(o-benzoyloxime) or o-acetyl-1-[6-(2-methylbenzoyl)-9-ethyl-9H-carbazolyl-3-yl]ethanoneoxime or the like can be used.

As the benzophenone derivative, bis(diethylamino)benzophenone or the like can be given.

As the thitanocene, bis($\eta^5$-cyclopentadienyl)bis[2,6-difluoro-3-(1H-pyrrol-1-yl)]phenyl titanium or the like can be given.

In this negative-type photosensitive resin composition, the component (b) has a function of lowering the solubility of the light-exposed part in an aqueous alkaline solution by a cross-linking reaction by light-exposure.

In the photosensitive resin composition of the present invention, the content of the component (b) (photosensitizer) is, in respect of the difference in dissolution rate between the exposed part and the un-exposed part and sensitivity, preferably 5 to 100 parts by mass, more preferably 8 to 40 parts by mass, relative to 100 parts by mass of the component (a) (polybenzoxazole precursor).

(Component (c): Solvent)

With respect to the component (c) (solvent) used in the present invention, examples thereof include γ-butyrolactone, ethyl lactate, propylene glycol monomethyl ether acetate, benzyl acetate, n-butyl acetate, ethoxyethyl propionate, 3-methyl methoxypropionate, N-methyl-2-pyrrolidone, N,N-dimethylformamide, N,N-dimethylacetamide, dimethyl sulfoxide, hexamethylphosphorylamide, tetramethylene sulfone, cyclohexanone, cyclopentanone, diethyl ketone, diisobutyl ketone, and methyl amyl ketone. Normally, no specific restrictions are imposed as long as it can sufficiently dissolve other components in the photosensitive resin composition. Of these, in respect of excellent solubility of each component and applicability at the time of forming a resin film, γ-butyrolactone, ethyl lactate, propylene glycol monomethyl ether acetate, N-methyl-2-pyrrolidone, N,N-dimethylformamide and N,N-dimethylacetoamide are preferably used.

These solvents may be used singly or in combination of two or more. With respect to the amount of the solvent used, although there are no particular restrictions, it is generally preferred that the amount of the solvent in the photosensitive composition be adjusted to 20 to 90% by mass.

(Component (d): Cross-Linking Agent)

The component (d) (cross-linking agent) used in the present invention is a compound that reacts (crosslinks) with a polybenzoxazole precursor or polybenzoxazole in the photosensitive resin composition at the heat treatment step that is performed after application, light-exposure and development or polymerizes itself. By this, even if the photosensitive resin composition is cured at a relatively low temperature, for example, at 200° C. or lower, excellent mechanical properties, resistance to chemicals, and flux resistance can be obtained.

Although there are no particular restrictions on the component (d) as long as it is a compound capable of causing crosslinking or polymerization at the heat treatment step, the component (d) may preferably be a compound having in the molecule thereof a methylol group, an alkoxyalkyl group such as an alkoxymethyl group, an epoxy group, an ocetacenyl group or a vinyl ether group. The compound may preferably be a compound having the aforementioned group bonded to a benzene ring, or may be a melamine resin or urea resin substituted with at least one of a methylol group and an alkoxymethyl group at the N-position. A compound having the aforementioned group bonded to a benzene ring having a phenolic hydroxyl group is more preferred because the compound can increase the dissolution speed of the light-exposed part during the development, thereby to improve the sensitivity. Particularly, more preferred is a compound having two or more methylol groups or alkoxymethyl groups in the molecule thereof, in terms of the sensitivity and the stability of a varnish and prevention of melting of the patterned photosensitive resin film upon curing.

As the cross-linking agent (d), a compound represented by the following formulas (XIII) to (XVI) can be given.

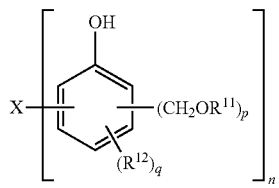
(XIII)

wherein X is a single bond, —O—, —SO$_2$— or a mono- to tetravalent organic group; $R^{11}$ is a hydrogen atom or a monovalent organic group; and $R^{12}$ is a monovalent organic group; n is an integer of 1 to 4; p is an integer of 1 to 4; and q is an integer of 0 to 3.

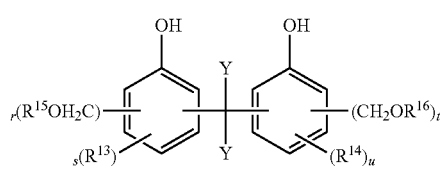
(XIV)

wherein Y is independently a hydrogen atom, an alkyl group having 1 to 10 carbon atoms, a fluoroalkyl group in which part or all of the hydrogen atoms is substituted by a fluorine atom, a hydroxyalkyl group in which part or all of the hydrogen atom is substituted by a hydroxyl group or an alkoxy group having 1 to 10 carbon atoms; $R^{13}$ and $R^{14}$ are independently a monovalent organic group; $R^{15}$ and $R^{16}$ are independently a hydrogen atom or a monovalent organic group; r and t are independently an integer of 1 to 3; and s and u are independently an integer of 0 to 3.

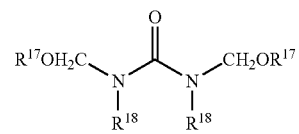
(XVa)

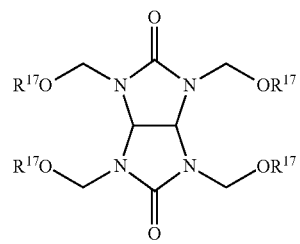
(XVb)

wherein $R^{17}$ and $R^{18}$ are independently a hydrogen atom or a monovalent organic group and $R^{18}$ may be bonded with each other to form a ring structure.

As a ring-structure compound formed by bonding of $R^{18}$, the following compound can be given.

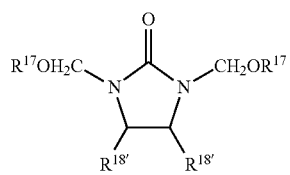

wherein $R^{18'}$ are independently a hydrogen atom or a monovalent organic group.

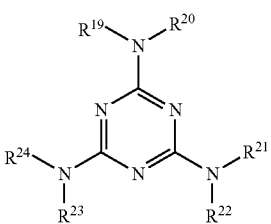
(XVI)

wherein $R^{19}$, $R^{20}$, $R^{21}$, $R^{22}$, $R^{23}$ and $R^{24}$ are independently a hydrogen atom, a methylol group or an alkoxymethyl group.

In the formulas (XIII) to (XV), as the monovalent organic group, an alkyl group, an alkoxy group, a hydroxyalkyl group, a hydroxyalkoxy group, each having 1 to 10 carbon atoms, and one in which part or all of the hydrogen atoms of an alkyl group, an alkoxy group, a hydroxyalkyl group, a hydroxyalkoxy group, each having 1 to 10 carbon atoms are substituted by a halogen atom can be given as preferable examples. Of these, it is preferable to use a compound represented by the formula (XVa) or (XVb), since when a photosensitive resin composition is cured at a low temperature of 200° C. or less, it is possible to obtain a cured film having an excellent chemicals resistance.

Here, more specific examples of the compound represented by the formulas (XIII) to (XVI) include the following compounds, though not limited thereto. These compounds can be used singly or in combination of two or more.

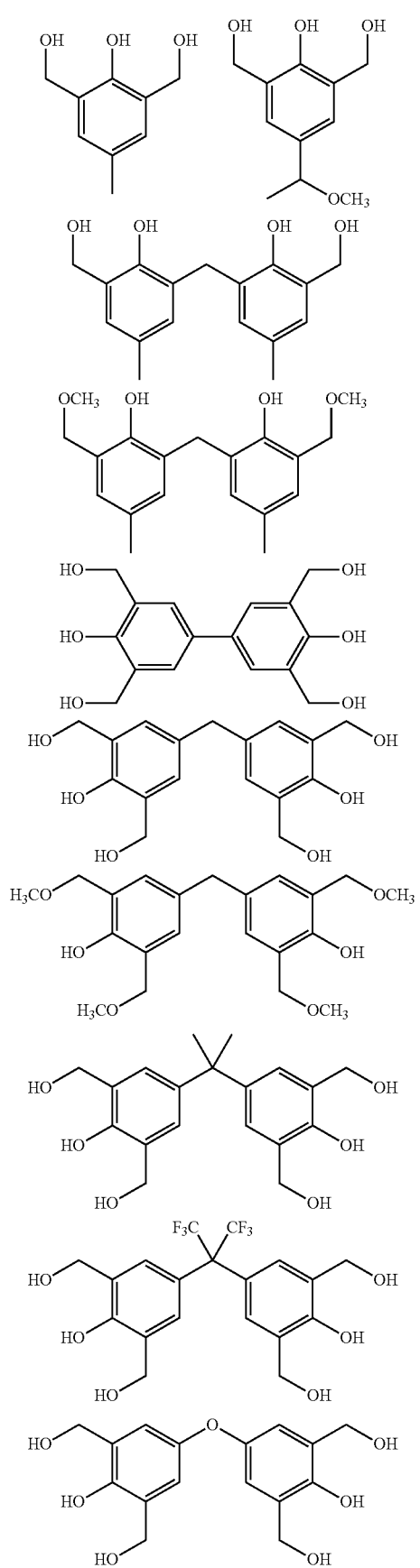
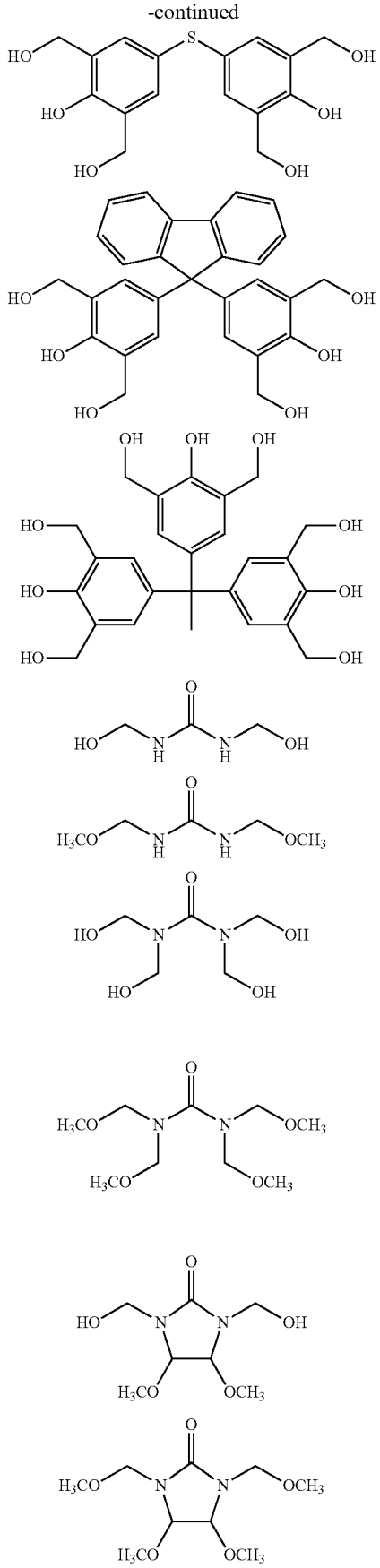

-continued

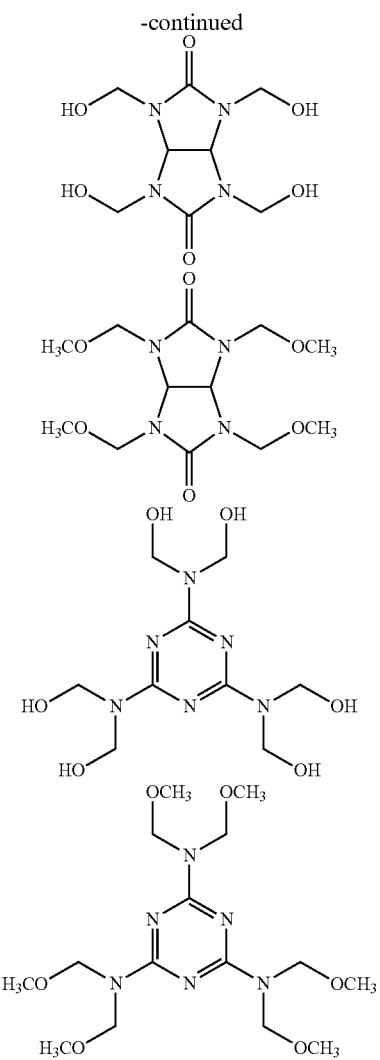

Of the above-mentioned compounds, in respect of excellent chemicals resistance and flux resistance, it is more preferred that the following compounds be used as the component (d).

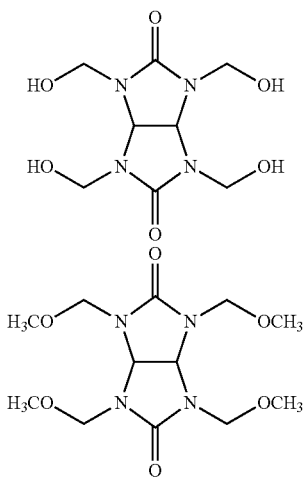

In the photosensitive resin composition of the present invention, the content of the component (d) is preferably 1 to 50 parts by mass relative to 100 parts by mass of the component (a), in respect of development time, sensitivity and the physical properties of a cured film. Further, in order to exhibit excellent chemicals resistance and flux resistance when the photosensitive resin composition is cured at 250° C. or less, the content of the component (d) is more preferably 15 to 50 parts by mass, with 20 to 50 parts by mass being further preferable.

(Component (e): Heterocyclic Compound Comprising a Hydroxyl Group, an Alkoxy Group or a Carboxy Group within the Molecule)

The component (e) of the present invention (a heterocyclic compound comprising a hydroxyl group, an alkoxy group or a carboxyl group within the molecule) has an effect of improving the adhesiveness with a metal such as copper or a copper alloy or the like. In addition, it has an effect of preventing corrosion of the photosensitive resin composition and a metal such as copper or a copper alloy or the like which is used in a wiring and a substrate. Further, it has effects of decreasing the difference in dissolution speed between a case when a photosensitive resin compound is applied to a silicon substrate and a case when a photosensitive resin composition is applied to other substrates, or effects of suppressing occurrence of metal migration. Here, the metal migration means a phenomenon in which, when a vias (voltage) is applied, metal (copper, for example) ions move between the opposing electrodes, and the metal is precipitated by reduction, thereby to occur short circuit by connecting the wirings.

These effects are significantly exhibited especially when the photosensitive resin composition is cured at low temperatures (for example, 250° C. or less). That is, according to the present invention, by using in combination the polybenzoxazole precursor which is preferably used for curing at low temperatures mentioned in the component (a) and the component (e), curing at low temperatures can be conducted. Further, even if curing is conducted at low temperatures, it is possible to obtain a photosensitive resin composition which fully develops film properties such as adhesiveness and mechanical properties.

The compounds represented by the formulas (XVa) and (XVb), which are the above-mentioned preferable component (d), although they generally provide excellent chemicals resistance, they may lower the adhesiveness with a substrate. However, by using in combination with the component (e) of the present invention, it is possible to exhibit sufficient adhesiveness to a substrate while maintaining excellent chemicals resistance at high temperature and high humidity conditions. That is, in the photosensitive resin composition of the present invention, it is more preferable to use the compound represented by the formula (XVa) or the formula (XVb) in combination with the component (e) in respect of attaining both chemicals resistance and the adhesiveness to a substrate.

Here, the heterocyclic compound means a cyclic compound composed of two or more elements (for example, carbon, nitrogen, oxygen, sulfur, or the like). As the heterocyclic compound, a compound having a triazole ring, a pyrrole ring, a furan ring, a thiophene ring, an imidazole ring, an oxazole ring, a thiazole ring, a pyrazole ring, an isoxazole ring, an isothiazole ring, a tetrazole ring, a pyridine ring, a pyridazine ring, a pyrimidine ring, a pyrazine ring, a piperidine ring, a piperazine ring, a morpholine ring, a 2H-pyran ring, a 6H-pyran ring or a triazine ring.

Of these, as the component (e), in respect of high anti-corrosion properties and excellent adhesiveness to a substrate, it is preferable to contain a compound having at least one imidazole ring, triazole ring and thiazole ring, each containing a carbon atom and a nitrogen atom. It is more preferred that a compound represented by any of the following formulas (II) to (VIII) be contained.

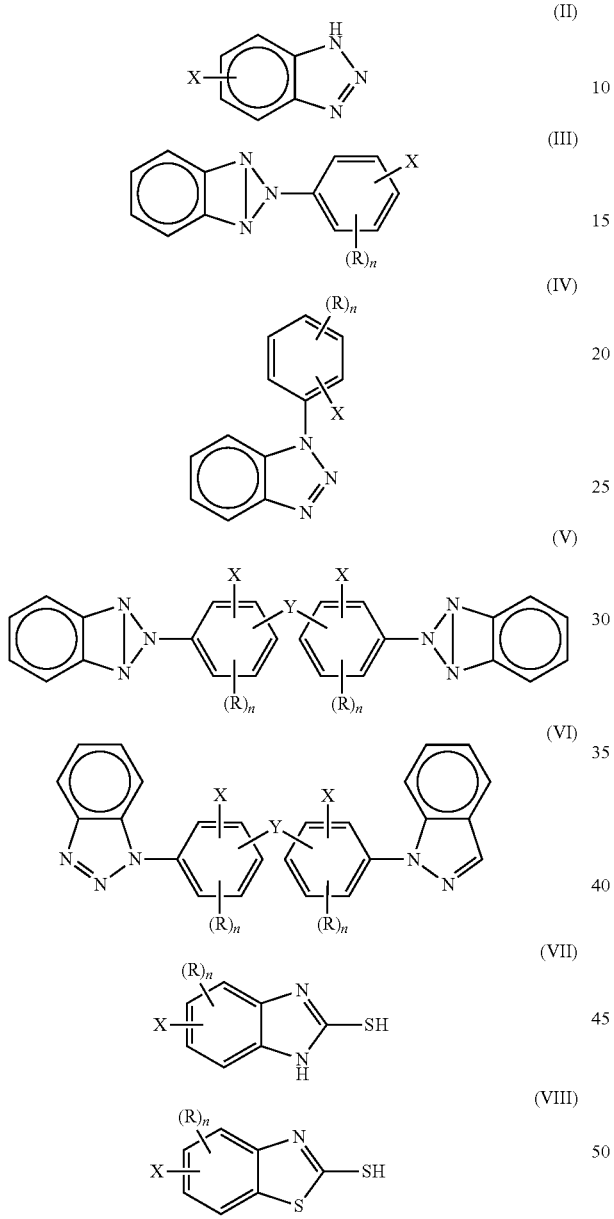

wherein X are independently a hydroxyl group, an alkoxy group having 1 to 6 carbon atoms or a carboxyl group; R is independently a hydrogen atom or an alkyl group having 1 to 10 carbon atoms; Y is a single bond or a group selected from —O—, —SO$_2$—, and a divalent organic group. n is the number of R, and in the formulas (III) and (IV), it is an integer of 0 to 4 and in the formulas (V), (VI), (VII) and (VIII), it is an integer of 0 to 3.

By using these compounds in combination with the component (a) (polybenzoxazole precursor) or a polybenzoxazole resin in which the component (a) is cyclized by cyclodehydration, it is possible to improve the adhesion with the substrate and the wiring under high temperature and high humidity conditions. The reason therefor is assumed to be as follows. The component (a) (polybenzoxazole precursor) or a polybenzoxazole resin in which the component (a) is cyclized by cyclodehydration and the component (e) form a chemical bond or a bond by Van der waals force, and as a result, a strong interaction is exhibited. As a result, even in the case of a pattern-cured film which is obtained by curing at low temperatures of 200° C. or less, it is possible to obtain practically satisfactory adhesiveness. These compounds are used singly or in combination of two or more.

Of the compounds represented by the formulas (II) to (VIII), in respect of attaining the effects of the present invention more sufficiently, it is preferable to use any of the compounds represented by the formulas (III) to (VI). It is preferable to use the compounds represented by the formulas (III) and (IV).

In particular, since no residues remain when forming a pattern, it is more preferable to use compounds represented by the following formula (IIIa) or (IVa).

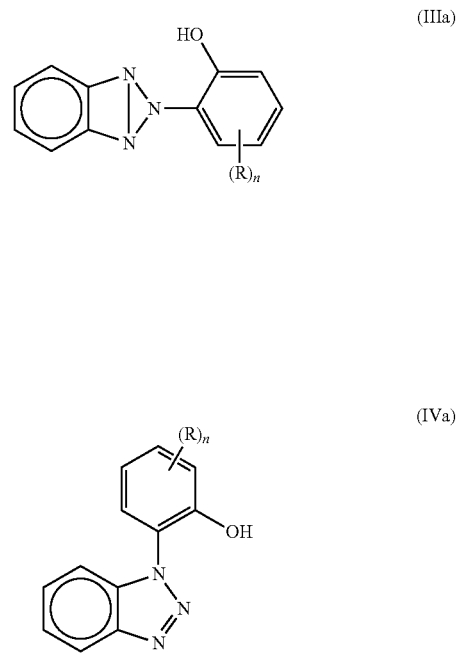

wherein n is the number of R, which is an integer of 0 to 4.

Specific examples of the compound represented by the formula (IIIa) include 2-(3,5-di-t-butyl-2-hydroxyphenyl)-2H-benzotriazole, 2-(2-hydroxy-5-t-butylphenyl)-2H-benzotriazole, 2-(2-hydroxy-5-t-octylphenyl)-2H-benzotriazole, 2-(2H-benzotriazole-2-yl)-p-cresole and 2-(2H-benzotriazole-2-yl)-4,6-di-t-pentylphenol or the like.

Specific examples of the compound represented by the formula (IVa) include 2-(3,5-di-t-butyl-2-hydroxyphenyl)-1-benzotriazole, 2-(2-hydroxy-5-t-butylphenyl)-1-benzotriazole, 2-(2-hydroxy-5-t-octylphenyl)-1-benzotriazole, 2-(benzotriazole-1-yl)-p-cresole, 2-(benzotriazole-1-yl)-4,6-di-t-pentylphenole or the like.

Of these, in respect of exhibiting the compatibility with a resin and the effects of the present invention more sufficiently, it is preferable to use 2-(2-hydroxy-5-t-octylphenyl)-2H-benzotriazole.

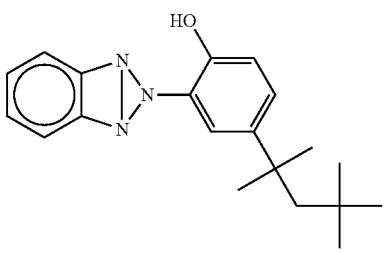

It is preferred that the content of the component (e) be 0.1 to 10 parts by mass relative to 100 parts by mass of the component (a). Due to the content of 0.1 to 10 parts by mass, it is possible to exhibit good adhesiveness to a substrate. Further, in respect of sensitivity, the content of the component (e) is more preferably 0.2 to 5 parts by mass, further preferably 0.2 to 5 parts by mass.

[Other Components]

The photosensitive resin composition according to the present invention comprises the above-mentioned components (a) to (e). The total of the composition of the present invention may be 100 parts by mass, being composed of the components (a) to (e) and the impurities inevitably mixed in. It is also possible to allow the total of components (a) to (e) to be 80 parts by mass or more, 90 parts by mass or more or 95 parts by mass or more.

In the photosensitive resin composition of the present invention, in addition to the above-mentioned components (a) to (e), (1) a silane coupling agent, (2) a dissolution accelerator, (3) a dissolution inhibitor, (4) a surfactant or a leveling agent or the like may be compounded.

((1) Silane Coupling Agent))

Normally, it is assumed that a silane coupling agent is cross-linked by reacting a polybenzoxazole precursor as the component (a) in the step of applying the photosensitive resin composition to a substrate, the resultant is exposed to light, followed by development, or that a silane coupling agent itself is polymerized in the step of a heat treatment. Due to the incorporation of a silane coupling agent, it is possible to improve the adhesiveness between the resulting cured film and the substrate. In particular, in the present invention, by using a silane coupling agent having a urea bonding within the molecule in the composition of the invention, it is possible to further enhance the adhesiveness with the substrate when curing is conducted at low temperatures of 250° C. or less.

As a preferable silane coupling agent, a compound having a urea bonding (—NH—CO—NH—) can be given. In respect of exhibiting good adhesion when curing is conducted at low temperatures, a compound represented by the following formula (XVII) is preferable.

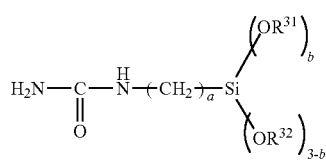

(XVII)

wherein $R^{31}$ and $R^{32}$ are independently an alkyl group having 1 to 5 carbon atoms; a is an integer of 1 to 10 and b is an integer of 1 to 3.

Specific examples of the compound represented by the formula (XVII) include ureidomethyltrimethoxysilane, ureidomethyltriethoxysilane, 2-ureidoethyltrimethoxysilane, 2-ureidoethyltriethoxysilane, 3-ureidopropyltrimethoxysilane, 3-ureidopropyltriethoxysilane, 4-ureidobutyltriethoxysilane and 4-ureidobutyltriethoxysilane. Of these, 3-ureidopropyltriethoxysilane is preferable.

Further, if a silane coupling agent having a hydroxy group or a glycidyl group is used in combination with the above-mentioned silane coupling agent having a urea bonding within the molecule, adhesiveness of a cured film to a substrate at the time of curing at low temperatures is further improved.

As the silane coupling agent having a hydroxy group or a glycidyl group, methylphenylsilane diol, ethylphenylsilane diol, n-propylphenylsilane diol, isopropylphenylsilane diol, n-butylphenylsilane diol, isobutylphenylsilane diol, tert-butylphenylsilane diol, diphenylsilane diol, ethylmethylphenyl silanol, n-propylmethylphenyl silanol, isopropylmethylphenyl silanol, n-butylmethylphenyl silanol, isobutylmethylphenyl silanol, tert-butylphenyl silanol, ethyl-n-propylphenyl silanol, ethylisopropylphenyl silanol, n-butylethylphenyl silanol, isobutylethylphenyl silanol, tert-butylethylphenyl silanol, methyldiphenyl silanol, ethyldiphenyl silanol, n-propyldiphenyl silanol, isopropyldiphenyl silanol, n-butyldiphenyl silanol, isobutyldiphenyl silanol, tert-butyldiphenyl silanol, phenylsilane triol, 1,4-bis(trihydroxysilyl)benzene, 1,4-bis(methyldihydroxysilyl)benzene, 1,4-bis(ethyldihydroxysilyl)benzene, 1,4-bis(propyldihydroxysilyl)benzene, 1,4-bis(butyldihydroxysilyl)benzene, 1,4-bis(dimethylhydroxysilyl)benzene, 1,4-bis(diethylhydroxysilyl)benzene, 1,4-bis(dipropylhydroxysilyl)benzene, 1,4-bis(dibutylhydroxysilyl)benzene or a compound represented by the following formula (XVIII) can be given.

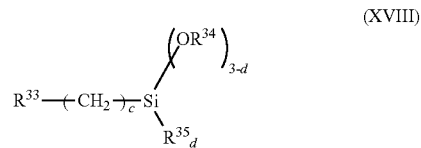

(XVIII)

wherein $R^{33}$ is a monovalent organic group having a hydroxy group or a glycidyl group; $R^{34}$ and $R^{35}$ are independently an alkyl group having 1 to 5 carbon atoms; c is an integer of 1 to 10; and d is an integer of 0 to 2.

Of the above-mentioned compounds, a compound represented by the formula (XVIII) is particularly preferable since it improves adhesiveness with a substrate.

As such a silane coupling agent, hydroxymethyltrimethoxysilane, hydroxymethyltriethoxysilane, 2-hydroxyethyltrimethoxysilane, 2-hydroxyethyltriethoxysilane, 3-hydroxypropyltrimethoxysilane, 3-hydroxypropyltriethoxysilane, 4-hydroxybutyltrimethoxysilane, 4-hydroxybutyltriethoxysilane, glycidoxymethyltrimethoxysilane, glycidoxymethyltriethoxysilane, 2-glycidoxyethyltrimethoxysilane, 2-glycidoxyethyltriethoxysilane, 3-glycidoxypropyltrimethoxysilane, 3-glycidoxypropyltriethoxysilane, 4-glycidoxybutyltrimethoxysilane, 4-glycidoxybutyltriethoxysiane or the like can be given.

The silane coupling agent containing a hydroxy group or a glycidyl group is preferably one which contains, together with a hydroxy group or a glycidyl group, a group containing a nitrogen atom, i.e. an amino group or an amide bond. As the silane coupling agent that contains an amino group, bis(2- hydroxymethyl)-3-aminopropyltriethoxysilane, bis(2-hydroxymethyl)-3-aminopropyltrimethoxysilane, bis(2-glycidoxymethyl)-3-aminopropyltriethoxysilane, bis(2-hydroxymethyl)-3-aminopropyltrimethoxysilane or the like can be mentioned. As the silane coupling agent containing an amide bond, an amide bond-containing compound represented by X—(CH$_2$)$_e$—CO—NH—(CH$_2$)$_f$Si(OR)$_3$ (X is a hydroxyl group or a glycidyl group; e and f are independently an integer of 1 to 3; and R is a methyl group, an ethyl group or a propyl group).

When a silane coupling agent is used, the content thereof is preferably 0.1 to 20 parts by mass, more preferably 1 to 10 parts by mass, and further preferably 0.3 to 10 parts by mass, relative to 100 parts by mass of the component (a).

((2) Dissolution Accelerator)

In the present invention, in order to further promote the dissolution property of a polybenzoxazole precursor as the component (a) in an aqueous alkaline solution, a dissolution accelerator may be added. As the dissolution accelerator, a compound having a phenolic hydroxyl group can be given, for example. A compound having a phenolic hydroxyl group can increase the dissolution speed of the exposed part when development is conducted by using an aqueous alkaline solution when it is added to the photosensitive resin composition, thereby to increase the sensitivity, and can prevent the photosensitive resin film from being molten when curing the photosensitive resin film after a pattern is formed.

Although no specific restrictions are imposed on the compound having a phenolic hydroxyl group, a compound having a relatively small molecular weight is preferable. As such a compound, o-cresole, m-cresole, p-cresole, 2,4-xylenol, 2,5-xylenol, 2,6-xylenol, bisphenol A, B, C, D, E, F and G, 4,4',4"-methylidynetrisphenol, 2,6-[(2-hydroxy-5-methylphenyl)methyl]-4-methylphenol, 4,4'-[1-[4-[1-(4-hydroxyphenyl)-1-methylethyl]phenyl]ethylidene)bisphenol, 4,4'-[1-[4-[2-(4-hydroxyphenyl)-2-propyl]phenyl]ethylidene)bisphenol, 4,4',4"-ethylidynetrisphenol, 4-[bis(4-hydroxyphenyl)methyl]-2-ethoxyphenol, 4,4'-[(2-hydroxyphenyl)methylene]bis[2,3-dimethylphenol], 4,4'-[(3-hydroxyphenyl)methylene]bis[2,6-dimethylphenol], 4,4'-[(4-hydroxyphenyl)methylene]bis[2,6-dimethylphenol], 2,2'-[(2-hydroxyphenyl)methylene]bis[3,5-dimethylphenol], 2,2'-[(4-hydroxyphenyl)methylene]bis[3,5-dimethylphenol], 4,4'-[(3,4-dihydroxyphenyl)methylene]bis[2,3,6-trimethylphenol], 4-[bis(3-cyclohexyl-4-hydroxy-6-methylphenyl)methyl]-1,2-benzenediol, 4,6-bis[(3,5-dimethyl-4-hydroxyphenyl)methyl]-1,2,3-benzenetriol, 4,4'-[(2-hydroxyphenyl)methylene]bis[3-methylphenol], 4,4',4"-(3-methyl-1-propanyl-3-ylidyne)trisphenol, 4,4',4",4'''-(1,4-phenylenedimethylidyne)tetrakisphenol, 2,4,6-tris[(3,5-dimethyl-4-hydroxyphenyl)methyl]-1,3-benzenediol, 2,4,6-tris[(3,5-dimethyl-2-hydroxyphenyl)methyl]-1,3-benzenediol, and 4,4'-[1-[4-[1-(4-hydroxyphenyl)-3,5-bis[(hydroxy-3-methylphenyl)methyl]phenyl]-phenyl)ethylidene]bis[2,6-bis(hydroxy-3-methylphenyl)methyl]phenol or the like can be given.

From the viewpoint of the development time and sensitivity, the amount of the dissolution accelerator is preferably 1 to 30 parts by mass, and more preferably 3 to 25 parts by mass, relative to 100 parts by mass of the component (a).

((3) Dissolution Inhibitor)

In the present invention, it is possible to contain a dissolution inhibitor, which is a compound that inhibits dissolution of polybenzoxazole as the component (a) in an aqueous alkaline solution. By inhibiting the dissolution of the component (a), a dissolution inhibitor serves to control the thickness of the remaining film or the development time. Since an acid generated therefrom easily vaporizes, it is thought that a dissolution inhibitor does not relate to the dehydration cyclization of a polybenzoxazole precursor.

As the compound which can be used as a dissolution inhibitor, diphenyl iodonium salts such as diphenyliodonium nitrate, bis(p-tert-butylphenyl)iodonium nitrate, diphenyliodonium bromide, diphenyliodonium chloride, and diphenyliodonium iodide can be preferably given.

From the viewpoint of the development time and sensitivity, the amount of the dissolution inhibitor is preferably 0.01 to 50 parts by mass, and more preferably 0.01 to 30 parts by mass, with 0.1 to 20 parts by mass being further preferable, relative to 100 parts by mass of the component (a).

((4) Surfactant or Leveling Agent)

In the photosensitive resin composition according to the present invention, for improving coating properties such as preventing striation (uneven thickness), and for improving the developing properties, an appropriate surfactant or leveling agent may be added.

Examples of such surfactants or leveling agents include polyoxyethylene lauryl ether, polyoxyethylene stearyl ether, polyoxyethylene oleyl ether, and polyoxyethylene octyl phenol ether, as well as commercially available products such as product names "MEGAFACS F171", "F173", "R-08" (each manufactured by Dainippon Ink & Chemicals Incorporated), product names "Fluorad FC430", "FC431" (each manufactured by Sumitomo 3M Limited), and product names "Organosiloxane polymer KP341", "KBM303", "KBM403", "KBM803" (each manufactured by Shin-Etsu Chemical Co., Ltd.).

The content of a surfactant or a leveling agent is preferably 0.01 to 10 part by mass, more preferably 0.05 to 5 parts by mass, further preferably 0.05 to 3 parts by mass relative to 100 parts by mass of the component (a).

[Method for Producing a Pattern-Cured Film]

Subsequently, the method for manufacturing a pattern-cured film according to the present invention will described below. The method for manufacturing a pattern-cured film according to the present invention comprises the steps of:

applying the photosensitive resin composition according to the invention to a supporting substrate and drying the resin composition to form a photosensitive resin film;

exposing to light the photosensitive resin film obtained by the application and drying steps in a prescribed pattern;

developing the photosensitive resin film after the light-exposure by using an aqueous alkaline solution; and subjecting the photosensitive resin film after the development to a heat treatment. Each step will be described below.

(Step of Forming a Photosensitive Resin Film)

In this step, firstly the photosensitive resin composition according to the present invention is applied to a substrate formed of, for example, glass, a semiconductor, a metal oxide insulator (such as $TiO_2$ or $SiO_2$), silicon nitride, copper and a copper alloy by spin coating using a spinner or the like, and then dried using a hot plate or an oven. The heating temperature is preferably 100 to 150° C. Thereby a photosensitive resin film that is a film of the photosensitive resin composition may be obtained.

(Light-Exposure Step)

At the subsequent light-exposure step, the photosensitive resin film formed as a coating film on the substrate is subjected to light-exposure through a mask by irradiation with active rays of light, such as ultraviolet light, visible light, or radiation. As the light-exposure apparatus, a parallel light exposure machine, a projection light-exposure machine, a stepper, and a scanner light-exposure machine can be used.

(Development Step)

In the development step, the photosensitive resin film after the light-exposure is treated with a developer to obtain a photosensitive resin film in which a pattern is formed. In general, when a positive-type photosensitive resin composition is used, an exposed part is removed by a developer, and, if a negative-type photosensitive resin composition is used, an un-exposed part is removed by a developer.

Preferred examples of a developer may include alkaline aqueous solutions of, e.g., sodium hydroxide, potassium hydroxide, sodium silicate, ammonia, ethylamine, diethylamine, triethylamine, triethanolamine, and tetramethylammonium hydroxide. It is preferable to use tetramethylammonium hydroxide.

The aqueous solution preferably has a concentration of 0.1 to 10% by mass. An alcohol or a surfactant may be added to the developer, each of which may be added in an amount in the range of preferably 0.01 to 10 parts by mass, and more preferably 0.1 to 5 parts by mass, relative to 100 parts by mass of the developer.

(Heat Treatment Step)

In the heat treatment step, the photosensitive resin film in which a pattern is formed obtained after the development is subjected to a heat treatment, a polyoxazole precursor as the component (a) is subjected to cyclodehydration to obtain an oxazole ring, and a cross-linking structure or the like is formed between the functional groups of the component (a) or between the component (a) and the component (d), whereby a pattern-cured film can be formed.

In the heat treatment step, the heating temperature may be equal to or less than 280° C., more preferably 120 to 280° C., further preferably 160 to 250° C., with 160 to 200° C. being particularly preferable.

The heat treatment is performed using a quartz tube oven, a hot plate, a rapid thermal anneal, a vertical diffusion oven, an infrared curing oven, an electron-beam curing oven, a microwave curing oven or the like. The atmosphere for heat treatment may be selected from an atmosphere of air and an atmosphere of an inert gas such as nitrogen gas. The nitrogen gas atmosphere is desirable because the photosensitive resin composition film can be prevented from oxidation. The above-mentioned range of heating temperature is lower than the heating temperature conventionally employed, and therefore damages to the substrate or device can be suppressed. Therefore, by using the method for manufacturing a pattern according to the present invention, a device can be produced in a high yield. Further, the energy required for the process can be saved.

In the heat treatment of the present invention, as an alternative to the use of a general oven filled with nitrogen gas, a microwave curing apparatus or variable-frequency microwave curing apparatus may also be used. By using such an apparatus, while maintaining the temperature of the substrate or device at, for example, 220° C. or lower, only the photosensitive resin composition film can be effectively heated (see Japanese Patent No. 2587148, for example). When curing is performed with a microwave in a pulse form while changing the frequency of the microwave, standing waves can be prevented, and thus it is preferable because uniform heating on the surface of the substrate can be performed.

When a substrate having a metal wiring, such as an electronic part, is irradiated with a microwave in a pulse form while changing the frequency of the microwave, for example, the occurrence of electronic discharge from the metal can be suppressed, whereby the electronic component can be advantageously prevented from breaking.

Further, irradiating a microwave in a pulse form is preferable, since it is possible to retain the prescribed heating temperature, whereby damage on the photosensitive resin film or the substrate can be eliminated.

The time for cyclodehydration of the polybenzoxazole precursor contained in the photosensitive resin composition according to the present invention is a period of time during which the cyclodehydration reaction proceeds satisfactorily, and from the viewpoint of achieving a high operating efficiency, the time for the cyclodehydration is generally 5 hours or less. The atmosphere for the cyclodehydration may be selected from an atmosphere of air and an atmosphere of an inert gas such as nitrogen gas.

[Process for Producing a Semiconductor Device]

As an example of the method for manufacturing a pattern-cured film according to the present invention, a process for manufacturing a semiconductor device will be described below with reference to the accompanying drawings.

FIG. 1 is a schematic cross-sectional view of the semiconductor device having a re-wiring structure which is the embodiment of the present invention. The semiconductor device of the present invention has a multilayer wiring structure. On an interlayer insulating layer (interlayer insulating film) 1, an Al wiring layer 2 is formed. On its top, an insulating layer (insulating film) 3 (P—SiN layer, for example) is formed, and a surface-protective layer (surface protective film) 4 for the device is formed thereon. From a pad part 5 of the wiring layer 2, a re-wiring layer 6 is formed, and the re-wiring layer 6 extends to the upper part of a core part 8 which is a part at which the re-wiring layer 6 and a conductive ball 7 formed of a solder, gold or the like as an external connection terminal are connected. On the surface-protective layer 4, a cover coating layer 9 is formed. The re-wiring layer 6 is connected to the conductive ball 7 through a barrier metal 10. In order to retain this conductive ball 7, a collar 11 is provided. In order to implement a package with such a configuration, an underfill 12 may be provided to further relax the stress.

In this figure, due to its excellent properties, the photosensitive resin composition of the invention is significantly suitable as a material not only for an interlayer insulating layer or a surface-protective layer, but also as a material for a cover coating layer, a core, a collar, an underfill or the like. A heat resistant photosensitive resin cured body obtained by using the photosensitive resin composition of the invention has excellent adhesiveness with a metal layer, a sealant or the like. In addition, due to its high stress relaxation effects, a semiconductor device using the heat resistant photosensitive resin cured body which is obtained from a photosensitive resin cured composition of the invention in a cover coating layer, a core, a collar, an underfill or the like has significantly excellent reliability.

No specific restrictions are imposed on the semiconductor device of the invention shown in FIG. 1, as long as it is provided with an interlayer insulating layer, a surface-protective layer, a cover coat, a re-wiring core, a collar for a ball such as solder, an underfill or the like, which each are formed by using the photosensitive resin composition of the invention. The semiconductor device can have various structures.

In the present invention, at the heating step which conventionally required heating at a temperature as high as about 350° C. for forming the pattern-cured film, curing can be made by heating at a temperature as low as 250° C. or less (200 to 250° C., for example). Since the photosensitive resin composition according to the present invention causes a cyclodehydration reaction satisfactorily even in the curing at 250° C. or lower, the resultant film has a small change in physical properties (such as extension, water absorption, weight loss temperature, and outgas), as compared to a film hardened at 300° C. or higher. Therefore, the temperature for the process can be lowered, so that the device is prevented from suffering defects due to heat, making it possible to obtain a semiconductor device (electronic part) having excellent reliability in a high yield.

[Electronic Components]

Subsequently, the electronic component according to the present invention will be described. The electronic component according to the present invention has a pattern-cured film formed by the aforementioned method for manufacturing a pattern using the aforementioned photosensitive resin composition. Examples of electronic parts include semiconductor devices, multilayer wiring boards, and various types of electronic devices.

Specifically, the pattern-cured film can be used for forming a surface-protective film or interlayer insulating film of an electronic component, such as a semiconductor device, or an interlayer insulating film of a multilayer wiring board. With respect to the electronic part according to the present invention, there are no particular limitations as long as it has a surface-protective film or interlayer insulating film formed using the photosensitive resin composition, and the electronic component may be of various structures.

EXAMPLES

The present invention will be described in more detail with reference to the following Examples and Comparative Examples, which should not be construed as limiting the scope of the invention.

Synthesis of Polybenzoxazole Precursor

Synthesis Example 1

60 g of N-methylpyrrolidone was charged into a 0.2-liter flask equipped with a stirrer and a thermometer, and 13.92 g of 2,2-bis(3-amino-4-hydroxyphenyl)hexafluoropropane was added to the N-methylpyrrolidone and dissolved by stirring. Subsequently, 9.56 g (40 mmol) of sebacic acid dichloride was added dropwise to the resultant solution over 10 minutes while maintaining the temperature at 0 to 5° C., followed by stirring for 60 minutes. The resultant solution was poured in 3 liters of water, and the precipitated material was collected and washed with pure water three times, and then subjected to vacuum drying to obtain polyhydroxyamide (polybenzoxazole precursor) (hereinafter referred to as "polymer I"). The polymer I had a weight average molecular weight of 33,100, as measured by a GPC method with standard polystyrene conversion, and the degree of dispersion was 2.0.

The conditions for measuring the weight average molecular weight by the GPC method are as follows.
Apparatus: Detector L4000 UV, manufactured by Hitachi, Ltd.
Pump: L6000, manufactured by Hitachi, Ltd.
C-R4A Chromatopac, manufactured by Shimadzu Corporation
Measurement conditions: Column Gelpack GL-S300MDT-5, 2 columns
Eluent: THF/DMF=1/1 (volume ratio)
LiBr (0.03 mol/l), $H_3PO_4$ (0.06 mol/l)
Flow rate: 1.0 ml/min, Detector: UV 270 nm
A solution of 0.5 milligram of a polymer in 1 milliliter of a solvent [THF/DMF=1/1 (volume ratio)] was used for measurement.

Synthesis Example 2

A synthesis was conducted under the same conditions as in Synthesis Example 1, except that the sebasic acid dichloride used in Synthesis Example 1 was replaced by dodecanedioic acid dichloride. The obtained polyhydroxyamide (hereinafter referred to as "polymer II") had a weight average molecular weight of 31,600, as measured with standard polystyrene conversion, and the degree of dispersion was 2.0.

Synthesis Example 3

A synthesis was conducted under the same conditions as in Synthesis Example 1, except that the sebasic acid dichloride used in Synthesis Example 1 was replaced by adipic acid dichloride. The obtained polyhydroxyamide (hereinafter referred to as "polymer III") had a weight average molecular weight of 29,300, as measured with standard polystyrene conversion, and the degree of dispersion was 1.9.

Synthesis Example 4

60 g of N-methylpyrrolidone was charged into a 0.2-liter flask equipped with a stirrer and a thermometer, and 13.92 g (38 mmol) of 2,2-bis(3-amino-4-hydroxyphenyl)hexafluoropropane was added to the N-methylpyrrolidone and dissolved by stirring. Subsequently, 7.65 g (32 mmol) of sebasic acid dichloride and 2.36 g (8 mmol) of diphenylether dicarboxylic acid dichloride were respectively added dropwise to the resultant solution over 10 minutes while maintaining the temperature at 0 to 5° C. The solution was heated to room temperature, and stirred for 3 hours. The solution was poured in 3 liters of water, and the precipitated material was collected and washed with pure water three times, and then depressurized to obtain polyhydroxyamide (hereinafter referred to as "polymer IV"). The polymer IV had a weight average molecular weight of 32,500, as measured by a GPC method with standard polystyrene conversion, and the degree of dispersion was 2.2.

Synthesis Example 5

60 g of N-methylpyrrolidone was charged into a 0.2-liter flask equipped with a stirrer and a thermometer, and 13.92 g (38 mmol) of 2,2'-bis(3-amino-4-hydroxyphenyl)hexafluoropropane was added to the N-methylpyrrolidone and dissolved by stirring. Subsequently, 8.55 g (32 mmol) of dodecanedioic acid dichloride and 2.36 g (8 mmo) of diphenylether dicarboxylic acid dichloride were respectively added dropwise to the resultant solution over 10 minutes while maintaining the temperature at 0 to 5° C., followed by stirring for 3 hours. The resultant solution was poured in 3 liters of water, and the precipitated material was collected and washed with pure water three times, and then depressurized to obtain polyhydroxyamide (hereinafter referred to as "polymer V"). The polymer V had a weight average molecular weight of 39,500, as measured by a GPC method with standard polystyrene conversion, and the degree of dispersion was 1.9.

Examples 1 to 17 and Comparative Examples 1 to 3

A solution of a photosensitive resin composition was prepared by using the components and the amount ratio shown in Table 1. The amount ratio shown in Table 1 is the part by mass of the components (b), (c), (d) and (e) relative to 100 parts by mass of each polymer as the component (a).

The components used in the reaction are as follows.
Component (b)

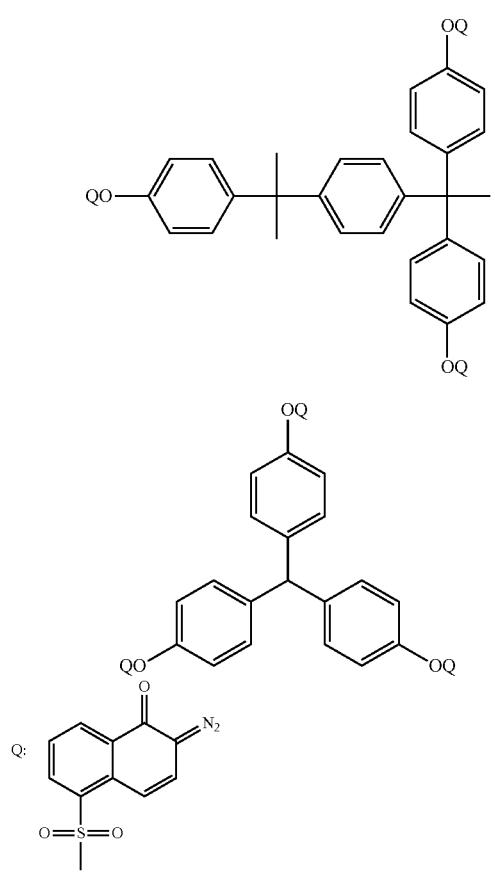

Component (c)
BLO: γ-butyrolactone
EL: Ethyl lactate
NMP: N-methylpyrrolidone
Component (d)

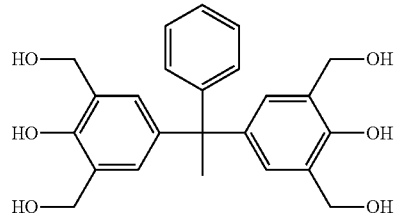

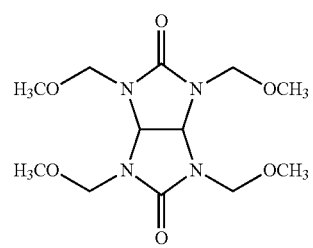

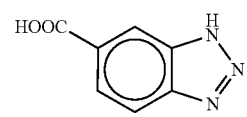

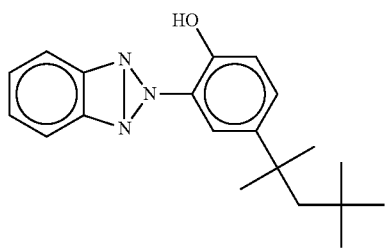

D1: 4,4'-(1-phenylethylidene)bis[2,6-bis(hydroxymethyl)phenol]
D2: 1,3,4,6-tetrakis(methoxymethyl)glycouril
D3: 4,4'-methylenebis(2-methyl-6-hydroxymethylphenol)
D4: 2,2-bis(4-glycidyloxyphenyl)propane
D5: Bis(3-ethyloxetane-3-ylmethyl)ether
Component (e)

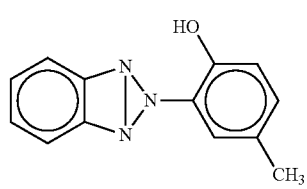

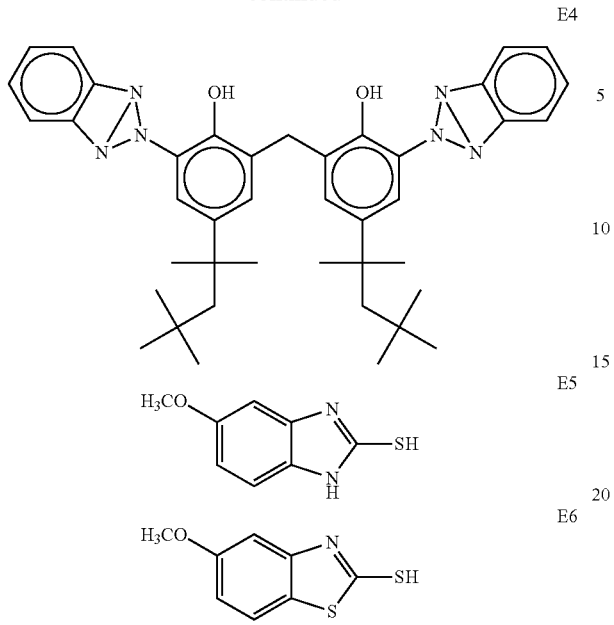

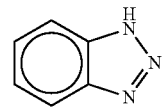

E1: CBT-1 (1H-1,2,3-benzotriazole-5-carboxylic acid, manufactured by Johoku Chemical Co., Ltd.)

E2: Adekastab LA-29 (2-(2-hydroxy-5-t-octylphenyl)-2H-benzotriazole, Product Name, manufactured by Adeka Corporation)

E3: Adekastab LA-32 (2-(2H-benzotriazole-2-yl)-p-cresole, Product Name, manufactured by Adeka Corporation)

E4: Adekastab LA-31 (Product Name, manufactured by Adeka Corporation)

E5: 5-methoxy-1H-benzimidazole-2-thiol (manufactured by Tokyo Chemical Industry Co., Ltd.)

E6: 6-methoxy-1,3-benzothiazole-2-yl-hydrosulfide (manufactured by Tokyo Chemical Industry Co., Ltd.)

E7: 1H-1,2,3-benzotriazole (manufactured by Tokyo Chemical Industry Co., Ltd.)

TABLE 1

| | | Examples | | | | | | | | | |
|---|---|---|---|---|---|---|---|---|---|---|---|
| | | 1 | 2 | 3 | 4 | 5 | 6 | 7 | 8 | 9 | 10 |
| Component a | Polymer I | 100 | 100 | 100 | 100 | 100 | 100 | 100 | 100 | 100 | 100 |
| | Polymer II | 0 | 0 | 0 | 0 | 0 | 0 | 0 | 0 | 0 | 0 |
| | polymer III | 0 | 0 | 0 | 0 | 0 | 0 | 0 | 0 | 0 | 0 |
| | Polymer IV | 0 | 0 | 0 | 0 | 0 | 0 | 0 | 0 | 0 | 0 |
| | Polymer V | 0 | 0 | 0 | 0 | 0 | 0 | 0 | 0 | 0 | 0 |
| Component b | B1 | 10 | 10 | 10 | 10 | 10 | 10 | 10 | 10 | 10 | 10 |
| | B2 | 0 | 0 | 0 | 0 | 0 | 0 | 0 | 0 | 0 | 0 |
| Component c | BLO | 150 | 150 | 150 | 150 | 150 | 150 | 150 | 150 | 150 | 150 |
| | EL | 0 | 0 | 0 | 0 | 0 | 0 | 0 | 0 | 0 | 0 |
| | NMP | 0 | 0 | 0 | 0 | 0 | 0 | 0 | 0 | 0 | 0 |
| Component d | D1 | 20 | 20 | 20 | 20 | 20 | 20 | 0 | 0 | 0 | 0 |
| | D2 | 0 | 0 | 0 | 0 | 0 | 0 | 20 | 0 | 10 | 10 |
| | D3 | 0 | 0 | 0 | 0 | 0 | 0 | 0 | 15 | 0 | 0 |
| | D4 | 0 | 0 | 0 | 0 | 0 | 0 | 0 | 0 | 10 | 0 |
| | D5 | 0 | 0 | 0 | 0 | 0 | 0 | 0 | 0 | 0 | 10 |
| Component e | E1 | 2 | 0 | 0 | 0 | 0 | 0 | 0 | 0 | 0 | 0 |
| | E2 | 0 | 2 | 0 | 0 | 0 | 0 | 0 | 0 | 0 | 0 |
| | E3 | 0 | 0 | 2 | 0 | 0 | 0 | 0 | 0 | 0 | 0 |
| | E4 | 0 | 0 | 0 | 2 | 0 | 0 | 0 | 0 | 0 | 0 |
| | E5 | 0 | 0 | 0 | 0 | 2 | 0 | 2 | 2 | 2 | 2 |
| | E6 | 0 | 0 | 0 | 0 | 0 | 2 | 0 | 0 | 0 | 0 |
| | E7 | 0 | 0 | 0 | 0 | 0 | 0 | 0 | 0 | 0 | 0 |

| | | Examples | | | | | | | Com. Ex. | | |
|---|---|---|---|---|---|---|---|---|---|---|---|
| | | 11 | 12 | 13 | 14 | 15 | 16 | 17 | 1 | 2 | 3 |
| Component a | Polymer I | 0 | 0 | 0 | 0 | 100 | 0 | 0 | 100 | 100 | 100 |
| | Polymer II | 100 | 0 | 0 | 0 | 0 | 100 | 100 | 0 | 0 | 0 |
| | polymer III | 0 | 100 | 0 | 0 | 0 | 0 | 0 | 0 | 0 | 0 |
| | Polymer IV | 0 | 0 | 100 | 0 | 0 | 0 | 0 | 0 | 0 | 0 |
| | Polymer V | 0 | 0 | 0 | 100 | 0 | 0 | 0 | 0 | 0 | 0 |
| Component b | B1 | 10 | 10 | 10 | 10 | 10 | 0 | 0 | 10 | 10 | 10 |
| | B2 | 0 | 0 | 0 | 0 | 0 | 10 | 10 | 0 | 0 | 0 |
| Component c | BLO | 150 | 0 | 150 | 150 | 0 | 150 | 150 | 150 | 150 | 150 |
| | EL | 0 | 0 | 0 | 0 | 150 | 0 | 0 | 0 | 0 | 0 |
| | NMP | 0 | 150 | 0 | 0 | 0 | 0 | 0 | 0 | 0 | 0 |
| Component d | D1 | 20 | 20 | 20 | 20 | 20 | 20 | 0 | 0 | 0 | 0 |
| | D2 | 0 | 0 | 0 | 0 | 0 | 0 | 20 | 0 | 20 | 20 |
| | D3 | 0 | 0 | 0 | 0 | 0 | 0 | 0 | 0 | 0 | 0 |
| | D4 | 0 | 0 | 0 | 0 | 0 | 0 | 0 | 0 | 0 | 0 |
| | D5 | 0 | 0 | 0 | 0 | 0 | 0 | 0 | 0 | 0 | 0 |

TABLE 1-continued

| Component e | E1 | 2 | 2 | 2 | 2 | 0 | 2 | 0 | 2 | 0 | 0 |
|---|---|---|---|---|---|---|---|---|---|---|---|
| | E2 | 0 | 0 | 0 | 0 | 2 | 0 | 2 | 0 | 0 | 0 |
| | E3 | 0 | 0 | 0 | 0 | 0 | 0 | 0 | 0 | 0 | 0 |
| | E4 | 0 | 0 | 0 | 0 | 0 | 0 | 0 | 0 | 0 | 0 |
| | E5 | 0 | 0 | 0 | 0 | 0 | 0 | 0 | 0 | 0 | 0 |
| | E6 | 0 | 0 | 0 | 0 | 0 | 0 | 0 | 0 | 0 | 0 |
| | E7 | 0 | 0 | 0 | 0 | 0 | 0 | 0 | 0 | 0 | 2 |

Evaluation 1

For the photosensitive resin composition prepared in Examples 1 to 17 and Comparative Examples 1 to 3, the sensitivity and the dissolution speed when a pattern-resin film was formed. Specifically, the photosensitive resin composition prepared in each example was applied onto a silicon substrate and a copper substrate by spin coating to form a resin film having a dry thickness of 7 to 12 μm. The resulting resin film was, through an interference filter, irradiated with i-rays having an intensity of 100 to 1000 mJ/cm$^2$ in a prescribed pattern using an ultrahigh pressure mercury lamp to conduct light exposure. After the light exposure, development was conducted by an aqueous solution of 2.38 mass % of tetramethylammonium hydroxide (TMAH) until the silicon substrate or the copper substrate which had been irradiated were exposed, and then, rinsing was conducted with water to form a pattern resin film.

For the resulting pattern resin film, the following evaluation was conducted.

(1) Evaluation of Sensitivity

In the formation of a pattern resin film on the silicon substrate, the required minimum exposure amount (sensitivity) required for opening of patterns in the exposed part when the remaining film ratio of the un-exposed part (ratio in thickness before and after the development) become 80% was obtained. The light exposure was conducted in a pattern (pattern-irradiating) by increasing the light-exposure amount from 100 mJ/cm$^2$ every 10 mJ/cm$^2$ to conduct development, the minimum exposure amount was judged by observing the opening pattern by means of a microscope.

The results are shown in Table 2.

(2) Difference in Sensitivity Between the Substrates

Similarly, in the formation of a pattern resin film on the copper substrate, the minimum exposure amount (sensitivity) required for a pattern of the exposed part to be opened when the remaining film ratio of the non-exposed part (ratio in film thickness before and after the development) became 80% was obtained.

Using the sensitivity when a pattern resin film was formed on a silicon substrate as a standard, one in which a difference between the sensitivity when forming a pattern resin film on a silicon substrate and the sensitivity when forming a pattern resin film on a copper substrate was less than 10% was evaluated as A (particularly good), one in which such difference was 10 to 15% was evaluated as B (good) and one in which such difference was larger than 15% was evaluated as C (not practical).

The results are shown in Table 2.

(3) Difference in Dissolution Speed Between Substrates

In forming a pattern resin film on a silicon substrate and a copper substrate, the dissolution speed of an exposed part was obtained based on the time required for the development in each case. The dissolution speed was obtained by dividing the thickness of a film dissolved within a prescribed time (film thickness before the development—film thickness after the development) by the time ((the thickness of a film dissolved)/(dissolution time)).

Using the dissolution speed when a pattern resin film was formed on a silicon substrate as a standard, one in which a difference between the dissolution speed when forming a pattern resin film on a silicon substrate and the dissolution speed when forming a pattern resin film on a copper substrate was less than 10% was evaluated as A (particularly good), one in which such difference was 10 to 15% was evaluated as B (good) and one in which such difference was larger than 15% was evaluated as C (not practical).

The results are shown in Table 2.

Evaluation 2

A pattern-cured film was produced from a pattern resin film produced in the evaluation 1 above, and the adhesion and the chemicals resistance were evaluated. Specifically, a silicon substrate provided with the pattern resin film and a copper substrate provided with the pattern resin film were heated at 100° C. for 1 hour in a nitrogen atmosphere by using a vertical diffusion furnace (μ-TF, manufactured by Koyo Thermo Systems Co., Ltd.), followed by further heating at 250° C. or 200° C. for 1 hour, whereby a pattern-cured film (film thickness after curing: 5 to 10 μm) was obtained.

For the resulting pattern-cured film, the following evaluation was conducted.

(1) Evaluation of Adhesiveness

By using the thus produced copper substrate provided with a pattern-cured film, adhesiveness was evaluated by the stad pull method. Specifically, on the pattern-cured film of the copper substrate provided with a pattern-cured film which had been treated at high temperature and high humidity (131° C./85RH %) for 100 hours, an epoxy-based resin-coated aluminum-made pin was put up, and heated in an oven at 150° C. for one hour to allow the stad pin coated with an epoxy resin to be adhered to the cured film. This pin was pulled out by using a ROMULUS (manufactured by Quad Group Inc.), and the state when the epoxy resin was peeled off was visually observed.

A film having an adhesive strength of 600 kg/cm$^2$ or more was evaluated as A, a film having an adhesive strength of less than 600 kg/cm$^2$ but peeling occurred in the interface between the cured film and the epoxy resin or the epoxy resin and the aluminum-made pin was evaluated as B, and a film that underwent peeling in the interface of the copper substrate and the cured film was evaluated as C.

Evaluation was also made for the case where the treatment time at high-temperature and high-humidity conditions was changed to 200 hours and 300 hours. The results are shown in Table 2.

(2) Evaluation of Chemicals Resistance

Change in the cured film when the pattern-cured film formed on the silicon substrate (the film thickness after curing: 5 to 10 μm) after immersing in acetone, BLO or NMP for 15 minutes at room temperature was observed.

A film which did not suffer from occurrence of cracks or peeling and a change in film thickness before and after the immersion was 1 μm or less was evaluated as A, a film which did not suffer from occurrence of cracks or peeling and a change in film thickness before and after the immersion was more than 1 μm was evaluated as B, a film which did not suffer from occurrence of cracks but the cured film was peeled off from the substrate due to the swelling was evaluated as C, and a film which suffered from occurrence of cracks was evaluated as D.

The results are shown in Table 2.

exhibiting high cyclodehydration rate even at a low temperature is used as a base resin, and therefore a pattern-cured film of the resin composition has properties comparable to those of a film cured at a high temperature. In the method for manufacturing a pattern according to the present invention, by using the aforementioned photosensitive resin composi-

TABLE 2

| | | Examples | | | | | | | | | |
|---|---|---|---|---|---|---|---|---|---|---|---|
| | | 1 | 2 | 3 | 4 | 5 | 6 | 7 | 8 | 9 | 10 |
| Sensitivity (/mJ · m$^2$) | | 220 | 240 | 240 | 250 | 220 | 230 | 210 | 220 | 220 | 220 |
| Difference in sensitivity according to substrate | | A | A | A | A | A | A | A | A | A | A |
| Difference in dissolution speed according to substrate | | A | A | A | A | A | A | A | A | A | A |
| Adhesion when cured at 250° C. | 100 hours | A | A | A | A | A | A | A | A | A | A |
| | 200 hours | A | A | A | A | A | A | A | A | A | A |
| | 300 hours | A | A | A | A | A | A | A | A | A | A |
| Adhesion when cured at 200° C. | 100 hours | A | A | A | A | A | A | A | A | A | A |
| | 200 hours | A | A | A | A | A | B | B | A | A | A |
| | 300 hours | B | A | A | A | B | B | B | B | B | B |
| Chemicals resistance when cured at 250° C. | Acetone | B | B | B | B | B | B | B | B | B | B |
| | BLO | B | B | B | B | B | B | B | B | B | B |
| | NMP | A | A | A | A | A | A | A | A | A | A |
| Chemicals resistance when cured at 200° C. | Acetone | B | B | B | B | B | B | B | B | B | B |
| | BLO | B | B | B | B | B | B | B | B | B | B |
| | NMP | B | B | B | B | B | B | B | B | B | A |

| | | Examples | | | | | | | Com. Ex. | | |
|---|---|---|---|---|---|---|---|---|---|---|---|
| | | 11 | 12 | 13 | 14 | 15 | 16 | 17 | 1 | 2 | 3 |
| Sensitivity (/mJ · m$^2$) | | 210 | 250 | 210 | 210 | 180 | 230 | 240 | 230 | 220 | 240 |
| Difference in sensitivity according to substrate | | A | A | A | A | A | A | A | A | C | A |
| Difference in dissolution speed according to substrate | | A | A | A | A | A | A | A | A | C | A |
| Adhesion when cured at 250° C. | 100 hours | A | A | A | A | A | A | A | A | B | A |
| | 200 hours | A | A | A | A | A | A | A | A | B | B |
| | 300 hours | A | B | A | A | A | A | A | A | C | B |
| Adhesion when cured at 200° C. | 100 hours | A | A | A | A | A | A | A | A | C | B |
| | 200 hours | A | B | A | A | A | A | A | A | C | C |
| | 300 hours | B | B | B | B | A | B | A | A | C | C |
| Chemicals resistance when cured at 250° C. | Acetone | B | B | B | B | B | B | B | D | B | B |
| | BLO | B | B | B | B | B | B | B | D | B | B |
| | NMP | B | B | B | B | B | B | A | C | C | A |
| Chemicals resistance when cured at 200° C. | Acetone | B | B | B | B | B | B | B | D | B | B |
| | BLO | B | B | B | B | B | B | B | D | B | B |
| | NMP | B | B | B | B | B | B | A | C | C | C |

In each of Examples 1 to 17, excellent adhesion to a substrate and excellent chemicals resistance were confirmed. Further, even when curing was conducted at a low temperature of 200° C. or less, excellent adhesiveness with a substrate and chemicals resistance were exhibited.

On the other hand, in Comparative Example 1 in which no cross-linking agent was used, chemicals resistance was lowered. In Comparative Example 2 in which component (e) was not contained and in Comparative Example 3 in which a heterocyclic compound having no hydroxyl group, an alkoxy group or a carboxyl group within the molecule was used instead of the component (e), adhesiveness and chemicals resistance were lowered. In Comparative Examples 2 and 3, in particular, when curing was conducted at a low temperature of 200° C., adhesiveness was lowered.

INDUSTRIAL APPLICABILITY

In the photosensitive resin composition according to the present invention, a specific polybenzoxazole precursor exhibiting high cyclodehydration rate even at a low temperature is used as a base resin, and therefore a pattern-cured film of the resin composition has properties comparable to those of a film cured at a high temperature. In the method for manufacturing a pattern according to the present invention, by using the aforementioned photosensitive resin composition, there can be obtained a pattern-cured film that is advantageous not only in that it has excellent sensitivity and adhesion to a substrate under high temperature and high humidity conditions, but also in that, even formed at a low-temperature curing process, the pattern-cured film has excellent heat resistance, low water absorption, and a favorable form. The pattern-cured film obtained from the photosensitive resin composition according to the present invention has excellent adhesiveness and chemicals resistance, and further can be formed by curing by a low-temperature process and hence suppresses damages to a device, making it possible to obtain an electronic component with a high reliability.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The documents described in the specification of a Japanese application on the basis of which the present application claims Paris convention priority are incorporated herein by reference in its entirety.

The invention claimed is:

1. A photosensitive resin composition comprising:
   (a) a polybenzoxazole precursor;
   (b) a photosensitizer;
   (c) a solvent;
   (d) a cross-linking agent; and
   (e) a compound represented by any of the following general compounds (III) to (VIII):

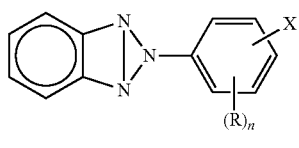
(III)

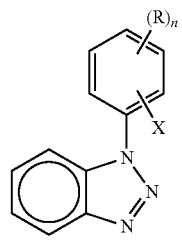
(IV)

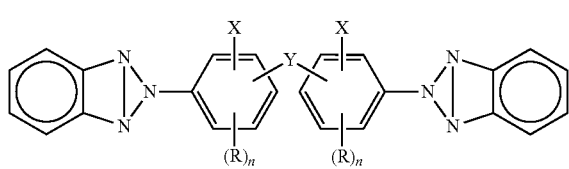
(V)

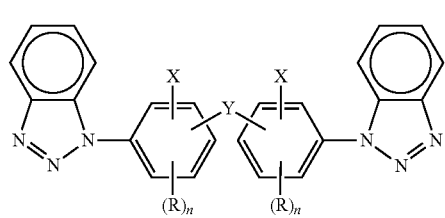
(VI)

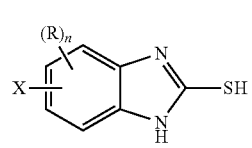
(VII)

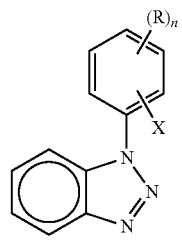
(VIII)

wherein X is independently a hydroxyl group, an alkoxy group having 1 to 6 carbon atoms or a carboxyl group; Y is a single bond, or a group selected from —O—, —SO$_2$— and a divalent organic group; and R is independently an alkyl group having 1 to 10 carbon atoms; and n is the number of R, and an integer of 0 to 4 in the formulas (III) and (IV) and an integer of 0 to 3 in the formulas (V), (VI), (VII) and (VIII).

2. The photosensitive resin composition according to claim 1, wherein the component (a) comprises a structural unit represented by the following formula (I):

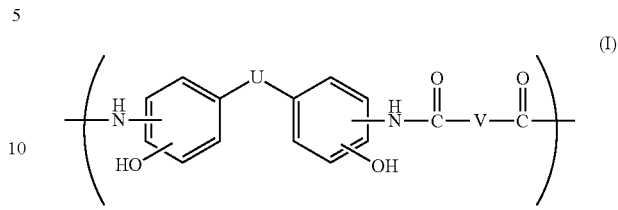

wherein U is a divalent organic group, a single bond, —O—, or —SO$_2$—, and V is a divalent organic group; and at least V is a group comprising an aliphatic structure having 1 to 30 carbon atoms or U is a group having an aliphatic structure of which the main chain has 2 to 30 carbon atoms.

3. The photosensitive resin composition according to claim 1, wherein the component (e) is a compound represented by the formula (III).

4. The photosensitive resin composition according to claim 1, wherein the component (d) is a compound having a methylol group or an alkoxyalkyl group.

5. The photosensitive resin composition according to claim 1, wherein the component (b) is a compound which generates an acid or a radical by exposure to light.

6. A method for producing a pattern-cured film comprising the steps of:
   applying the photosensitive resin composition according to claim 1 to a supporting substrate and drying the resin composition to form a photosensitive resin film;
   exposing to light the photosensitive resin film obtained by the application and drying steps in a prescribed pattern;
   developing the photosensitive resin film after the light-exposure by using an aqueous alkaline solution; and
   subjecting the photosensitive resin film after the development to a heat treatment.

7. The method for producing a pattern-cured film according to claim 6, wherein the heat treatment temperature is 250° C. or less in the step of subjecting the photosensitive resin film after the development to a heat treatment.

8. The method for producing a pattern-cured film according to claim 6, wherein the heat treatment temperature is 200° C. or less in the step of subjecting the photosensitive resin film after the development to a heat treatment.

9. An interlayer insulating film using a pattern-cured film obtained by the method for producing a pattern-cured film according to claim 6.

10. An electronic component having the interlayer insulating film according to claim 9.

11. A surface-protective film using a pattern-cured film obtained by the method for producing a pattern-cured film according to claim 6.

12. An electronic component having the surface-protective film according to claim 11.

13. The photosensitive resin composition according to claim 1, wherein the component (e) is a compound represented by the formula (IV).

14. The photosensitive resin composition according to claim 1, wherein the component (e) is a compound represented by the formula (V).

15. The photosensitive resin composition according to claim 1, wherein the component (e) is a compound represented by the formula (VI).

16. The photosensitive resin composition according to claim 1, wherein the component (e) is a compound represented by the formula (VII).

17. The photosensitive resin composition according to claim 1, wherein the component (e) is a compound represented by the formula (VIII).

18. The photosensitive resin composition according to claim 1, wherein the component (d) comprises at least one compound selected from the group consisting of

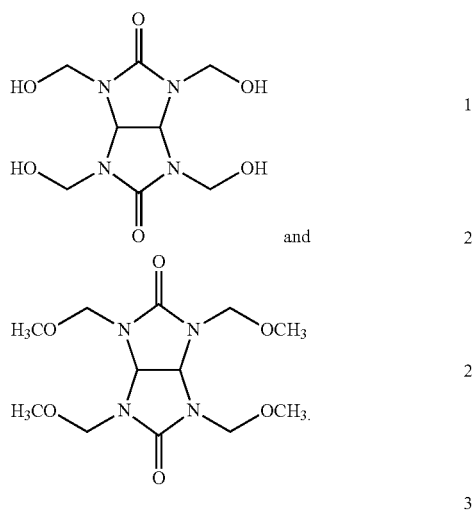

and

* * * * *